(12) United States Patent  
Poklemba

(10) Patent No.: US 8,489,662 B2
(45) Date of Patent: Jul. 16, 2013

(54) SYSTEMS AND METHODS FOR SLIDING CONVOLUTION INTERPOLATING FILTERS

(75) Inventor: John James Poklemba, Ijamsville, MD (US)

(73) Assignee: The Aerospace Corporation, El Segundo, CA (US)

(*) Notice: Subject to any disclaimer, the term of this patent is extended or adjusted under 35 U.S.C. 154(b) by 725 days.

(21) Appl. No.: 12/718,099

(22) Filed: Mar. 5, 2010

(65) Prior Publication Data

US 2011/0216853 A1    Sep. 8, 2011

(51) Int. Cl.
 G06F 17/10 (2006.01)
 G06F 17/00 (2006.01)

(52) U.S. Cl.
 USPC .................... 708/315; 708/300; 708/314

(58) Field of Classification Search
 None
 See application file for complete search history.

(56) References Cited

U.S. PATENT DOCUMENTS

| | | | |
|---|---|---|---|
| 4,489,393 A | 12/1984 | Kawahara et al. |
| 4,604,720 A | 8/1986 | Stikvoort |
| 5,206,821 A | 4/1993 | Young et al. |
| 5,216,696 A | 6/1993 | Poklemba |
| 5,341,335 A | 8/1994 | Young et al. |
| 5,453,797 A | 9/1995 | Nicolas et al. |
| 5,696,796 A | 12/1997 | Poklemba |
| 6,243,430 B1 | 6/2001 | Mathe |
| 6,243,431 B1 | 6/2001 | Han |
| 6,487,573 B1 | 11/2002 | Jiang et al. |
| 2003/0164975 A1 | 9/2003 | Aoyagi et al. |
| 2006/0274862 A1 | 12/2006 | Lui et al. |
| 2007/0085698 A1* | 4/2007 | Royle ................. 340/870.1 |
| 2008/0201628 A1 | 8/2008 | Liou et al. |
| 2008/0212708 A1 | 9/2008 | Koslov |
| 2011/0286648 A1* | 11/2011 | Sharif et al. .......... 382/131 |

OTHER PUBLICATIONS

Disclosure under 37 CFR 1.56 dated Mar. 5, 2010, filed for U.S. Appl. No. 12/718,099.

* cited by examiner

*Primary Examiner* — Scott Sun

(74) *Attorney, Agent, or Firm* — Sutherland Asbill & Brennan LLP

(57) ABSTRACT

Certain embodiments of the invention may include systems and methods for implementing a multirate digital interpolating filter. According to an example embodiment of the invention, the method includes sampling symbol data from one sample per symbol to N samples per symbol, wherein sampling includes: convolving the symbol data with a decimated finite impulse response (FIR) aperture impulse response coefficient set, convolving the symbol data with one or more shifted decimated FIR aperture impulse response coefficient sets, and summing the convolution results to produce interpolated bandlimited data.

20 Claims, 17 Drawing Sheets

SYSTEMS AND METHODS FOR SLIDING CONVOLUTION INTERPOLATING FILTERS

FIELD OF THE INVENTION

This invention generally relates to modulation of signals in variable rate information transmitter systems, and in particular, to sliding convolution interpolating filters.

BACKGROUND OF THE INVENTION

Digital data transmission systems have traditionally been designed for specific applications, and for accommodating relatively narrow ranges of data rates. Continuously variable rate transmitter and receiver systems, however, could provide certain desirable flexibilities; for example, in optimizing variable rate applications for bandwidth requirements, bit error rates, etc. Unfortunately, in order to accommodate flexible upsampling on the transmitter side, or downsampling on the receiver side, traditional data transmission systems have grown in size and hardware complexity. For example, transmission systems typically require a linear increase in the number of filter taps, multipliers, adds, and delay elements for a corresponding increase in the data upsampling and downsampling rate. Hence, the classical hardware solution may have an order-of-magnitude growth for each factor-of-ten increase in the sample rate. Another popular alternative to alleviate impractical hardware growth is the repeated use of multiply-accumulate (MAC) functions. However, this technique requires that the MAC run at integer multiples of the sample rate, greatly restricting top-end speeds. Yet another technique that has been attempted is comb-integrator-comb (CIC) filtering. Unfortunately, CIC filtering is restrictive in terms of filter pass band control characteristics, and CIC register widths tend to grow very large. Furthermore, when CIC filters are used as interpolators, truncation or rounding errors can produce an unstable response.

A need remains for improved systems and methods for upsampling filters.

BRIEF SUMMARY OF THE INVENTION

Some or all of the above needs may be addressed by certain embodiments of the invention. Certain embodiments of the invention may include systems and methods for providing a sliding convolution interpolating filter associated with the transmitter.

According to an example embodiment of the invention, a method is provided for implementing a multirate digital interpolating filter. The method includes sampling symbol data from one sample per symbol to N samples per symbol, wherein sampling comprises: convolving the symbol data with a decimated finite impulse response (FIR) aperture impulse response coefficient set, convolving the symbol data with one or more shifted decimated FIR aperture impulse response coefficient sets, and summing the convolution results to produce interpolated bandlimited data.

According to another example embodiment, a system is provided for implementing a multirate digital interpolating filter. The system includes at least one memory for storing FIR aperture impulse response coefficients. The system also includes at least one processor configured to access the at least one memory and further configured to upsample symbol data from one sample per symbol to N samples per symbol, wherein upsampling comprises: convolving the symbol data with a decimated FIR aperture impulse response coefficient set, convolving the symbol data with one or more shifted decimated FIR aperture impulse response coefficient sets, and summing the convolution results to produce interpolated bandlimited data. The system also includes at least one upconverter for modulating at least a portion of the interpolated bandlimited data.

According to another example embodiment, a filter is provided for upsampling and spectral shaping digital data. The filter includes at least one memory for storing FIR aperture impulse response coefficients, at least one processor configured to access the at least one memory, and further configured to upsample symbol data from one sample per symbol to N samples per symbol, wherein upsampling comprises: convolving the symbol data with a decimated FIR aperture impulse response coefficient set, convolving the symbol data with one or more shifted decimated FIR aperture impulse response coefficient sets; and summing the convolution results to produce interpolated bandlimited data.

Other embodiments and aspects of the invention are described in detail herein and are considered a part of the claimed invention. Other embodiments and aspects can be understood with reference to the following detailed description, and accompanying tables, drawings, and claims.

BRIEF DESCRIPTION OF THE FIGURES

Reference will now be made to the accompanying figures, which are not necessarily drawn to scale, and wherein.

DETAILED DESCRIPTION OF THE INVENTION

Figure 1:
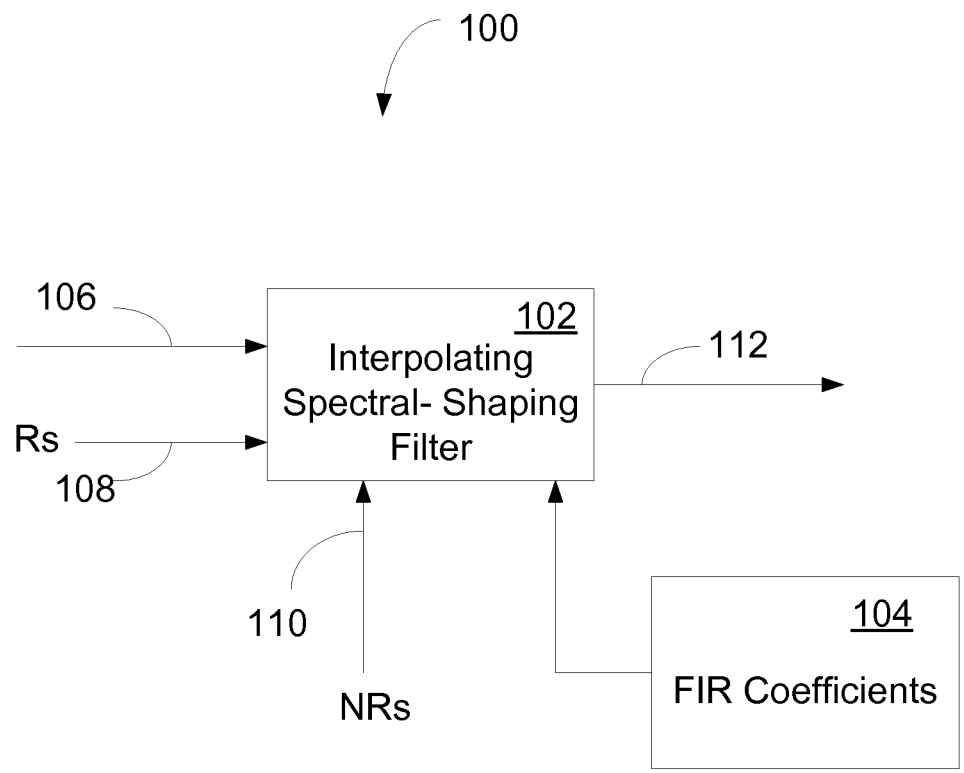
FIG. 1 is a block diagram of an illustrative sampling filter according to an example embodiment of the invention.

Embodiments of the invention will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Certain embodiments of the invention may enable variable data rate digital signal processing (DSP) with fixed hardware implementations. Example embodiments of the invention may provide continuously variable rate (or rate independent) DSP functions that may be associated with a digital communication system. In certain example embodiments of the invention, systems and methods are provided to implement variable rate digital data interpolation functions that may typically be associated with the transmitter side of a communications system. In other example embodiments of the invention, systems and methods are provided to implement variable rate decimation functions that may typically be associated with the receiver side of a communications system. According to example embodiments of the invention, signal processing may include various combinations of sampling, filtering, convolving, etc., for bandlimiting digital signals, and for removing replication spectra that result from digital sampling.

Example embodiments of the invention, including a sliding convolution interpolating (SCI) filter and a pre-averaged staggered convolution decimating (PASCoDec) filter, will now be described with reference to the accompanying figures.

Sliding Convolution Interpolating (SCI) Filter

According to example embodiments of the invention, a sliding convolution interpolating (SCI) filter is provided. The name "multirate digital interpolating filter" may be used interchangeably to denote the SCI filter. There are countless generic, digital signal processing (DSP) interpolation situations to which the SCI filter could apply. One aspect of the invention, which will become apparent as further details are presented, is the relatively rate-independent interpolation function that can be implemented without requiring corresponding changes in DSP hardware to accommodate different data rates. For example, the DSP hardware may be fixed, and the speed flexibility may be achieved by burdening memory whose densities and speeds are typically doubling every two years, in accordance with the well-known Moore's law.

An example application for the SCI filter is a Nyquist bandlimiting filter in a digital data transmission system. In accordance with example embodiments of the invention, the SCI filter may make repeated use of a sliding convolution function, where a reduced set of staggered coefficients are successively applied to a relatively compact, finite-impulse-response (FIR) circuit topology. In this manner, the number of digital multipliers and adds (e.g., hardware) required for the FIR remains fixed, while the memory size would grow with the number of samples per symbol needed. According to example embodiments of the invention, continuously variable data rate operation is achievable with this sample interpolation scheme, by increasing the number of samples per symbol as the data rate is reduced.

An example Nyquist bandlimiting interpolating system 100 is shown in FIG. 1. According to example embodiments, an interpolating spectral shaping filter 102 may apply the FIR coefficients 104 to the input digital data 106 to produce Nyquist-shaped samples 112, which may be interpolated bandlimited data at N samples/symbol. Therefore, in accordance with example embodiments of the invention, the input digital data 106 may be sampled and upconverted from 1 sample/symbol to N samples per symbol, where the upconversion ratio may be set by the sample rate input Rs 108 and the upconversion rate input NRs 110.

Figure 2:
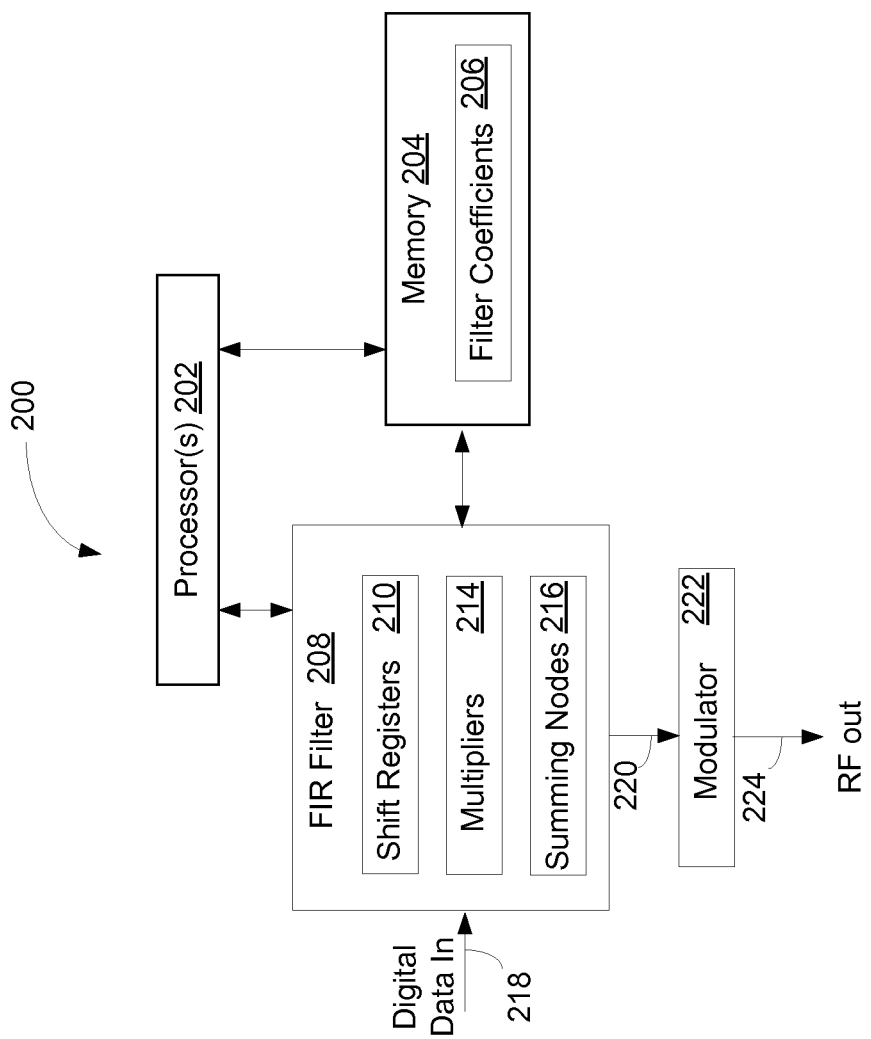
FIG. 2 is a block diagram of an illustrative sampling and filtering system according to an example embodiment of the invention.

FIG. 2 depicts a block diagram of an example Nyquist bandlimiting interpolation system 200. According to example embodiments of the invention, certain hardware may be included for implementing the Nyquist bandlimiting system. For example, the system 200 may include one or more processors 202 and one or more memories 204 accessible by the one or more processors 202. Filter coefficients 206 may be stored in the one or more memories 204, and may be utilized in a convolution with digital data in 218 via a FIR filter 208. The FIR filter may include shift registers 210, multipliers 214, and summing nodes 216. The FIR filter 208 may produce output bandlimited N-interpolated data 220, which may be modulated or upconverted by an optional modulator 222, for example, to the produce radio frequency (RF) output 224. According to example embodiments, the one or more processors 202 may be configured, programmed, or operable to perform memory accesses, timing, and other functions associated with the convolution process. A particular implementation of the Nyquist bandlimiting interpolation system 200 will be discussed below with reference to FIGS. 3 and 4.

Figure 3:
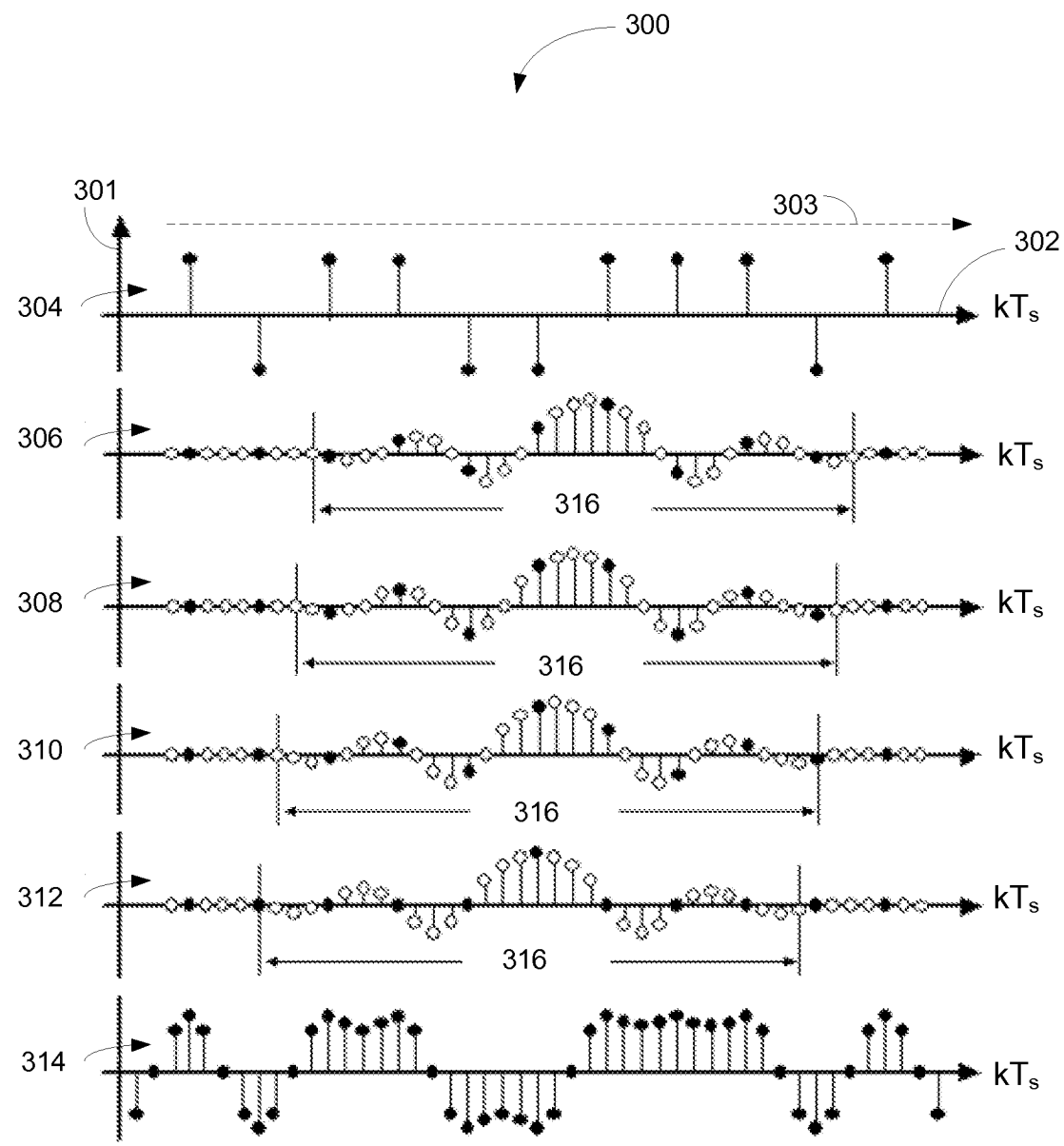
FIG. 3 is a graphical depiction of a sliding convolution finite impulse response (FIR) implementation, according to an example embodiment of the invention.

FIG. 3 is a graphical representation of upsampling and bandlimit filtering 300, according to example embodiments of the invention. Shown in FIG. 3 is a periodic, binary sample stream 304 representing the digital data input that may be continuously clocked 303 into the interpolating spectral shaping filter 102 at one sample per symbol. The periodic, binary sample stream 304 may be convolved with one set (darkened samples) from each of the FIR filter waveform samples 306, and also with the filter waveform samples (308, 310, 312) staggered by 1 to N samples to produce the output interpolated bandlimited data 314. In other words, each sample in the periodic, binary sample stream 304 may be convolved with sets of FIR filter coefficients (decimated FIR aperture impulse response coefficient set and shifted decimated FIR aperture impulse response coefficient sets) 316 at one sample per symbol yielding a single output value per sample for each convolution. In example embodiments of the invention the FIR filter waveform coefficients may be selected from any number of FIR filter impulse responses. In an example embodiment, the FIR filter waveform samples (e.g., the decimated FIR aperture impulse response coefficient sets 316) may be modeled from a "raised cosine" impulse response, which is a well-known filtering function of the Nyquist filter family. Next, staggered filter waveform samples (308, 310, 312) are repeatedly convolved against the same input samples 304, effectively providing filtering at the output upsample rate, N samples per symbol. The summation of each sparsely populated impulse response (306, 308, 310, 312), convolved with the input sequence (304) produces the periodically spaced output samples (output interpolated bandlimited data) 314. Therefore, the sample values in the gaps of the periodic, binary sample stream 304 are interpolated through these repeated convolutions with the staggered impulse responses. In this manner, upsampling, interpolation, spectral shaping, and pre-distortion, if desired, are all achieved in a single FIR processing block.

Figure 4:
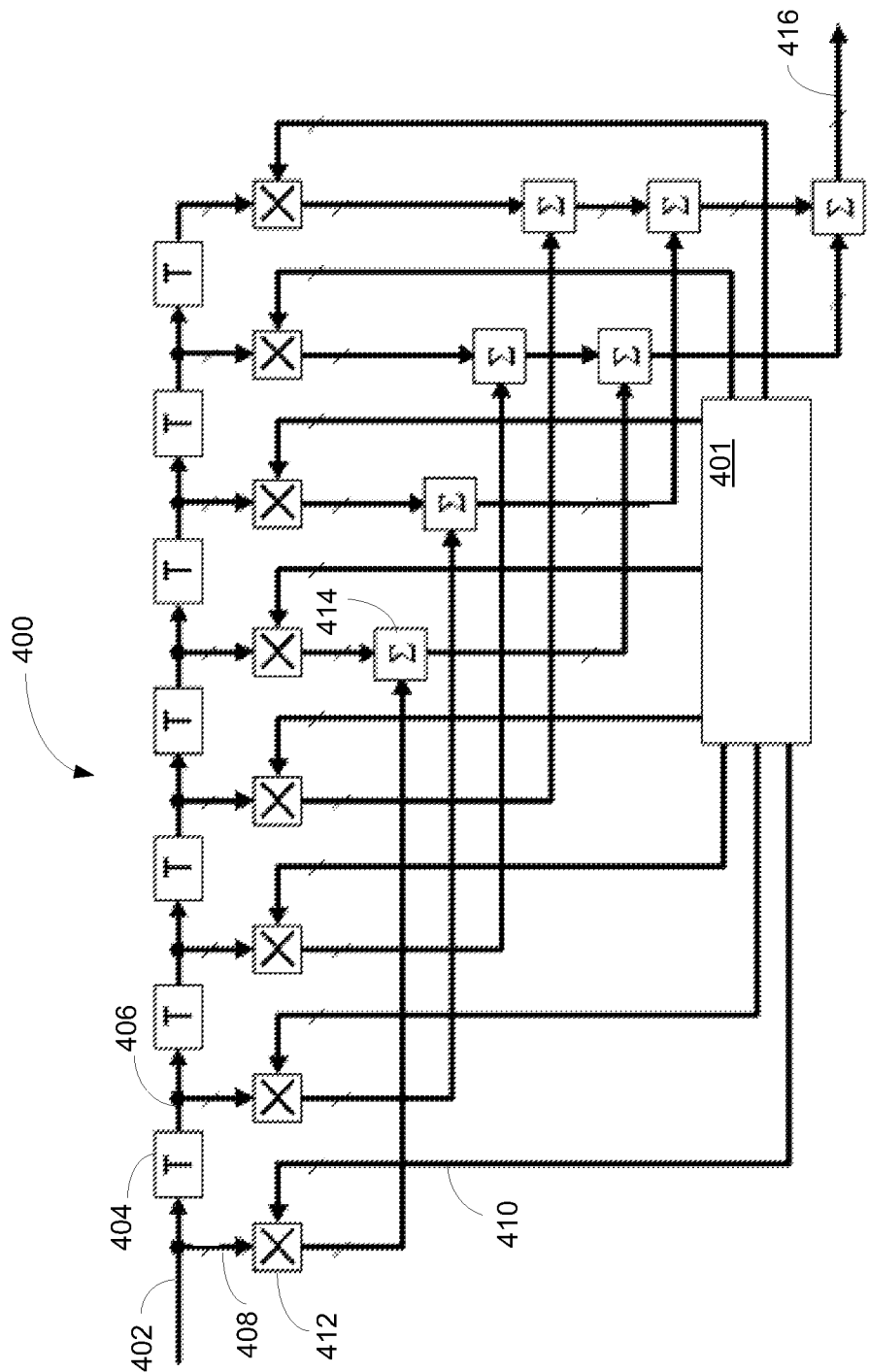
FIG. 4 is a block diagram of an illustrative FIR filtering system according to an example embodiment of the invention.

According to an example embodiment of the invention, a generalized block diagram of an interpolating FIR circuit topology 400 is shown in FIG. 4. In this example embodiment, a FIR coefficient memory 401 may be utilized to store and access FIR coefficients. The topology 400 may include a plurality of shift registers 404, multipliers 412, and summation blocks 414. In an example embodiment, an input sample stream 402, which may comprise periodic binary samples, may be continuously clocked through the shift registers 404. Then, after each shifting, the sample 408 at the input and the successively shifted samples 406 may be multiplied via multipliers 412 with FIR coefficients 410. The resulting samples may then be successively summed by summing nodes 414, resulting in output filtered bandlimited data 416.

Example values for the various elements of the interpolating FIR circuit topology 400 may include: aperture widths=eight symbol times (depicted by the number of shift registers T 404); 8×8-bit digital multipliers 412; data symbol rate range operable to vary over three orders-of-magnitude; data sample rate range about half an octave; and FIR coefficient memory 401 size approximately equal to the maximum number of samples per symbol times number of symbols in aperture times the number of bits per sample. Hence, as is apparent from FIG. 4, the performance burden is on the memory size and speed to keep the implementation compact.

TABLE 1 below lists sample rates and ranges for continuously variable rate operation with baseband gear shifting for a sliding convolution interpolating filter, according to an example embodiment of the invention. Continuously variable rate operation may be achieved by gear shifting the number of samples per symbol. In this manner, the sample rate may be kept in a fixed range, such that only a single replication removal (RR) filter is necessary. In TABLE 1, a maximum data rate of 60 M symbols/sec has been arbitrarily set for illustration purposes. Note that each octave in the data symbol rate is broken up into two ratio regions, 1:1.5 and 1:1.33; where the upper range always has samples per symbol that are powers-of-two, and the lower range has samples per symbol that are powers-of-two times three. Also, observe that the sample rates always fall within a 1:1.5 range. Hence, in a motor vehicle analogy, the sample rate is analogous to engine RPM, the number of samples per symbol to the gear ratio, and the data symbol rate to actual vehicle speed. The lowest integer power would be two samples per symbol, for this type of application using baseband Nyquist sampling.

TABLE 1

| Baseband Sample Rates | | | | |
|---|---|---|---|---|
| Symbol Rate Range | | Samples/ Symbol | Sample Rate Range | |
| Min (Ksps) | Max (Ksps) | | Min (Msps) | Max (Msps) |
| 58.59 | 78.13 | 1536 | 90.00 | 120.00 |
| 78.13 | 117.19 | 1024 | 80.00 | 120.00 |
| 117.19 | 156.25 | 768 | 90.00 | 120.00 |
| 156.25 | 234.38 | 512 | 80.00 | 120.00 |

TABLE 1-continued

| Baseband Sample Rates | | | | |
|---|---|---|---|---|
| Symbol Rate Range | | Samples/ Symbol | Sample Rate Range | |
| Min (Ksps) | Max (Ksps) | | Min (Msps) | Max (Msps) |
| 234.38 | 312.50 | 384 | 90.00 | 120.00 |
| 312.50 | 468.75 | 256 | 80.00 | 120.00 |
| 468.75 | 625.00 | 192 | 90.00 | 120.00 |
| 625.00 | 937.50 | 128 | 80.00 | 120.00 |
| 937.50 | 1250.00 | 96 | 90.00 | 120.00 |
| 1250.00 | 1875.00 | 64 | 80.00 | 120.00 |
| 1875.00 | 2500.00 | 48 | 90.00 | 120.00 |
| 2500.00 | 3750.00 | 32 | 80.00 | 120.00 |
| 3750.00 | 5000.00 | 24 | 90.00 | 120.00 |
| 5000.00 | 7500.00 | 16 | 80.00 | 120.00 |
| 7500.00 | 10000.00 | 12 | 90.00 | 120.00 |
| 10000.00 | 15000.00 | 8 | 80.00 | 120.00 |
| 15000.00 | 20000.00 | 6 | 90.00 | 120.00 |
| 20000.00 | 30000.00 | 4 | 80.00 | 120.00 |
| 30000.00 | 40000.00 | 3 | 90.00 | 120.00 |
| 40000.00 | 60000.00 | 2 | 80.00 | 120.00 |

Figure 5:
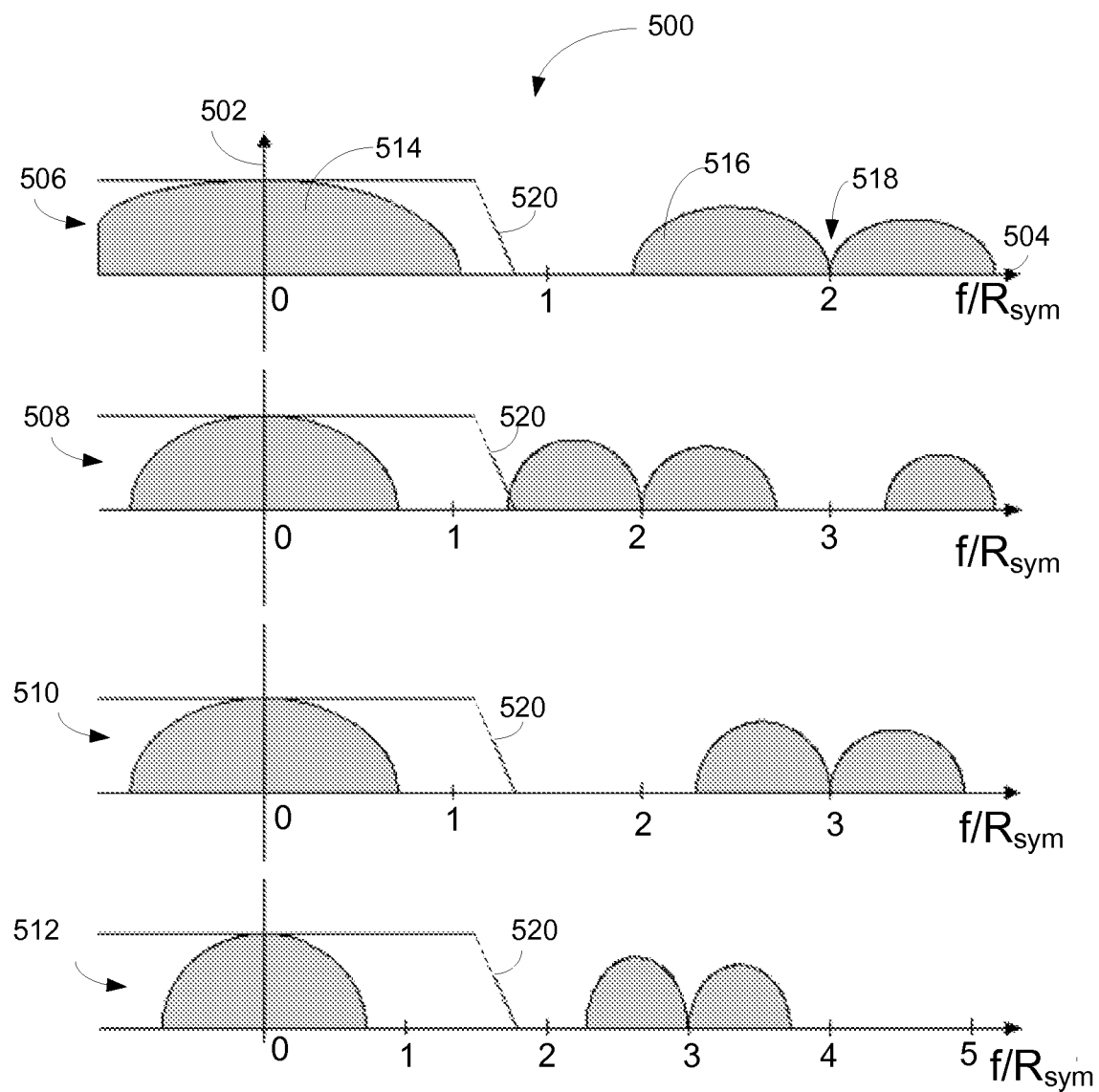
FIG. 5 is a graphical spectral depiction of baseband sampling and replication removal filtering, according to example embodiments of the invention.

The gear-shifting technique 500 is depicted in the frequency-domain for baseband sampling in FIG. 5. In this figure, a replication removal (RR) filter 520 is situated to remove all sampling rate replicas 516 (but to pass the baseband spectra 514) for the case where the data rate is continuously varied. Typically an elliptic analog filter function would be used as the RR filter 520 with an equiripple bandwidth on the order of ¾ the maximum data symbol rate, with a passband-to-stopband shapefactor on the order of 1:1.5. FIG. 5 shows the spectral filtering conditions at the minimum 508 and maximum 506 rates for two samples per symbol in the highest octave of operation. Also shown are spectral filtering conditions at the minimum 512 and maximum 510 rates for three samples per symbol in the highest octave of operation. Subsequent octaves occupy less bandwidth and are progressively less affected by the RR filter characteristics. Also depicted in FIG. 5 is a point near the central part of the replicas representing a zero crossing 518. This zero crossing occurs at the 2f/R frequency and is due to a sinc (=sin($\pi$f/R)/($\pi$f/R)) shape zero crossing that arises because the input samples are actually sampled and held, resulting in a sinc spectrum.

TABLE 2 below lists sample rates and ranges for continuously variable rate operation with intermediate frequency (IF) gear shifting for a sliding convolution interpolating filter, according to an example embodiment of the invention. TABLE 2 differs from TABLE 1 in that the minimum number of samples per symbol for IF sampling is double what it is for baseband sampling. Hence, the maximum data rate is halved. This doubling is a direct result of it being more difficult to avoid aliasing with IF sampling. Continuously variable rate operation is still achievable, but for a given hardware technology, the maximum data rate of operation is halved. IF sampling has other advantages in that it uses less hardware than baseband sampling, and the quadrature amplitude and phase balance is automatic and precise.

TABLE 2

IF Sample Rates

| Symbol Rate Range | | Samples/ Symbol | Sample Rate Range | |
|---|---|---|---|---|
| Min (Ksps) | Max (Ksps) | | Min (Msps) | Max (Msps) |
| 29.30 | 39.06 | 3072 | 90.00 | 120.00 |
| 39.06 | 58.59 | 2048 | 80.00 | 120.00 |
| 58.59 | 78.13 | 1536 | 90.00 | 120.00 |
| 78.13 | 117.19 | 1024 | 80.00 | 120.00 |
| 117.19 | 156.25 | 768 | 90.00 | 120.00 |
| 156.25 | 234.38 | 512 | 80.00 | 120.00 |
| 234.38 | 312.50 | 384 | 90.00 | 120.00 |
| 312.50 | 468.75 | 256 | 80.00 | 120.00 |
| 468.75 | 625.00 | 192 | 90.00 | 120.00 |
| 625.00 | 937.50 | 128 | 80.00 | 120.00 |
| 937.50 | 1250.00 | 96 | 90.00 | 120.00 |
| 1250.00 | 1875.00 | 64 | 80.00 | 120.00 |
| 1875.00 | 2500.00 | 48 | 90.00 | 120.00 |
| 2500.00 | 3750.00 | 32 | 80.00 | 120.00 |
| 3750.00 | 5000.00 | 24 | 90.00 | 120.00 |
| 5000.00 | 7500.00 | 16 | 80.00 | 120.00 |
| 7500.00 | 10000.00 | 12 | 90.00 | 120.00 |
| 10000.00 | 15000.00 | 8 | 80.00 | 120.00 |
| 15000.00 | 20000.00 | 6 | 90.00 | 120.00 |
| 20000.00 | 30000.00 | 4 | 80.00 | 120.00 |

Figure 6:
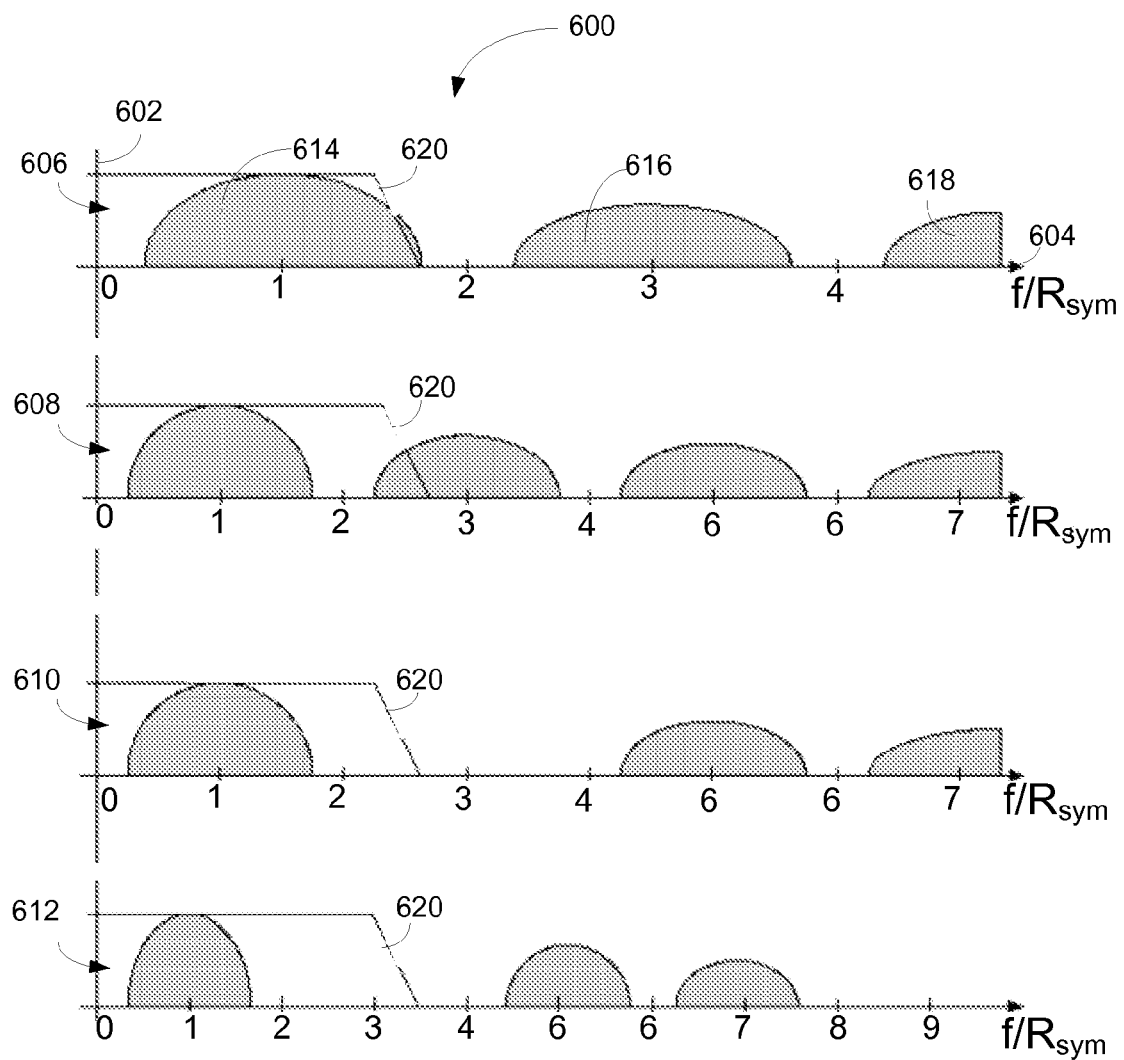
FIG. 6 is a graphical spectral depiction of intermediate frequency (IF) sampling and replication removal filtering, according to example embodiments of the invention.

In FIG. 6, gear shifting is graphically depicted for the case of IF sampling in the first Nyquist zone, where $f_{if}/R_{sym}=1$. A replication removal (RR) filter 620 is situated to remove all sampling rate replicas 616, 618 (but to pass the first IF spectra 614). Typically an elliptic analog filter function would be used as the RR filter 620 with an equiripple bandwidth on the order of 3/2 the maximum data symbol rate, with a passband-to-stopband shapefactor on the order of 1:1.5. FIG. 6 shows the spectral filtering conditions at the minimum 608 and maximum 606 rates for four samples per symbol in the highest octave of operation. Also shown are spectral filtering conditions at the minimum 612 and maximum 610 rates for six samples per symbol in the highest octave of operation. Subsequent octaves occupy less bandwidth and are progressively less affected by the RR filter characteristics.

In this spectral depiction, the continuously variable rate operation is analogous to the baseband case shown in FIG. 5. The spectral occupancy at the highest data rate in the first octave of operation is so broad that the same low pass elliptic RR filter is applicable. An aspect of this implementation is that it can be largely digitally switched from low pass to band pass sampling, without changing the RR filter.

Figure 7:
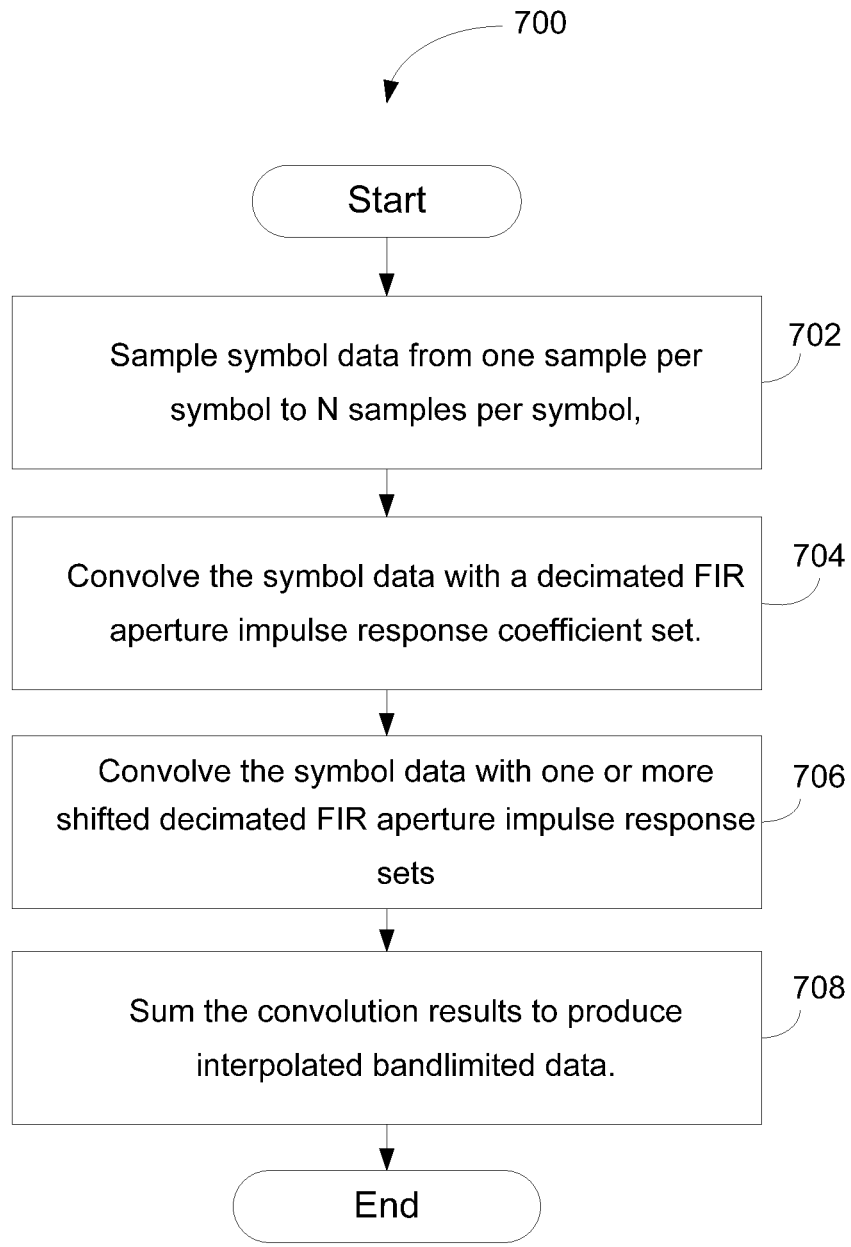
FIG. 7 is a flow diagram of an example method for implementing a multirate digital interpolating filter, according to an example embodiment of the invention.

An example method 700 for implementing a multirate digital interpolating filter (e.g., a sliding convolution interpolating SCI filter) will now be described with reference to the flow diagram of FIG. 7. In block 702 and according to an example embodiment of the invention, the method may include sampling symbol data from one sample per symbol to N samples per symbol. In block 704, the sampled symbol data may be convolved with a decimated FIR aperture impulse response coefficient set. In block 706, the symbol data may be convolved with one or more shifted decimated FIR aperture impulse response sets. In block 708, the convolution results may be summed to produce interpolated bandlimited data.

Additional aspects or embodiments of the invention may include systems and methods that may enable sampling the symbol data, where sampling comprises one or more of upsampling or spectral-shaping symbol data. According to example embodiments, convolving the symbol data with shifted decimated FIR aperture impulse response coefficient sets comprises convolving the symbol data with one-to-N-shifted decimated FIR aperture impulse response coefficient sets, wherein the one-to-N-shifted decimated FIR aperture impulse response coefficient sets are shifted by one-to-N samples with respect to the decimated FIR aperture impulse response coefficient sets. Embodiments of the invention may also include filtering the interpolated bandlimited data to remove spectral replicas.

According to example embodiments of the invention, sampling the symbol data may comprise sampling digital symbols, wherein the digital symbols comprise one or more of in-phase or quadrature-phase symbol data. Furthermore, convolving the symbol data with the decimated FIR aperture impulse response coefficient set may comprise convolving the symbol data with a Nyquist filtering function. According to example embodiments of the invention, sampling symbol data provides a sample per symbol rate of powers-of-two times three or powers-of-two.

The sliding convolution interpolating (SCI) filter may be realized according to other alternative embodiments. For example, the interpolating FIR circuit topology 400 depicted in FIG. 4 has been sized for a digital data transmission application where the maximum rate is 60 M symbols/sec. Other applications could result in FIR filters with longer or shorter apertures, different bit resolutions, sample pipelining, etc. Moreover, the direct form, FIR topology is shown, whereas other standard-form topologies could be used as well. Alternatively, interlaced sliding coefficient sets from the memory and alternating a single multiplier-accumulator could be used, but for this example, it would need to be eight times faster than the implementation of FIG. 4. Yet another embodiment would be a table look-up, where the filtering convolution results are pre-computed, and a concatenated address of the data and clock patterns access the memory. The disadvantage with the table look-up approach, however, is that memory size grows geometrically when the incoming data levels are more than binary. Hence, the density required quickly becomes unrealistically large.

Accordingly, example embodiments of the invention can provide the technical effects of creating certain systems and methods that provide an ability to operate over several orders-of-magnitude in data rate with a single analog filter. Embodiments of the invention can provide the further technical effects of providing systems and methods for either baseband or IF sampling. Embodiments of the invention may also provide the technical effects of creating certain systems and methods that provide simplicity and compactness of DSP element topology with continuous, inherent augmentations that may benefit from continued advances in digital memory technology. Embodiments of the invention can provide the further technical effects of providing systems and methods for building amplitude and phase pre-distortion directly into the FIR characteristic.

Pre Averaged Staggered Convolution Decimating (PASCoDec) Filter

In accordance with example embodiments of the invention, a pre-averaged staggered convolution decimating (PASCoDec) filter is provided. The name "multirate digital decimating filter" may be used interchangeably to denote the PASCoDec filter. The PASCoDec filter and the SCI filter (described above) share some similarities, particularly with regard to the finite impulse (FIR) circuit topology. However, the PASCoDec filter may be associated with a receiver portion of digital data communications system, rather than with the transmitter. Embodiments of the PASCoDec filter may provide a Nyquist bandlimiting filter. According to example embodiments of the invention, the PASCoDec filter may be a hardware-efficient manner for implementing a multirate digital decimating filter.

In accordance with example embodiments, a pre-averaging filter may be utilized to reduce the number of elements in the FIR circuit topology (e.g., multipliers, delays, and summing nodes). In an example embodiment, the implementation may be realized in a two-stage process to minimize hardware complexity. In the first stage, the incoming sampling rate may be decimated down to two samples per symbol. Then in the second stage, the functions of precisely controlled bandlimiting and pre-distortion may be realized. In interfacing the resultant signal into the analog domain, several orders-of-magnitude of continuously variable sample rate operations can typically be attained with a single analog anti-aliasing (AA) filter. The technique works equally well with either baseband or intermediate frequency (IF) sampling, but with IF sampling the maximum rate for a given hardware technology is cut in half.

In accordance with example embodiments of the invention, the PASCoDec filter may provide a relatively rate-independent decimation function with minimum hardware and maximum speed. The hardware and speed improvements may be achieved by a filter decimator block that averages down input samples to a manageable number. An aspect of the invention, according to certain embodiments, is that it may employ a pre-averaging function up front to reduce the required sample rate. Another aspect of the invention, according to example embodiments, is that it may repeatedly apply a convolution function, where filter coefficients are successively computed by a relatively compact FIR circuit topology. In this manner, the number of digital multipliers and adds required for the FIR remains fixed, and the Nyquist shaping can be precisely controlled. Additionally, continuously variable data rate operation is achievable with this sample decimation scheme, by increasing the number of samples per symbol as the data rate is reduced.

Additional aspects or embodiments of the invention may include systems and methods that may enable sampling received symbol data, wherein sampling comprises sampling in-phase or quadrature-phase symbol data. Example embodiments may include methods and systems that may enable sampling received symbol data. Example embodiments may include methods and systems that may enable sampling modulated received symbol data. In accordance with example embodiments of the invention, the shifted decimated FIR aperture impulse response coefficients may be shifted by one sample with respect to the decimated FIR aperture impulse response coefficients. According to example embodiments of the invention, detected output samples may comprise one sample per symbol. According to other alternative example embodiments of the invention, detected output samples may comprise more than one sample per symbol. In accordance with example embodiments of the invention, received symbol data may be filtered to remove spectral replicas and/or noise. According to example embodiments, sampling the received symbol data at a selected sample rate provides a sample per symbol rate of powers-of-two times three or powers-of-two. According to example embodiments, pre-averaging three samples per symbol to two samples per symbol comprises passing one of the samples to an output, and averaging the other two samples before sending them to the output, wherein averaging comprises digitally adding the other two symbols and bit shifting the result.

Figure 8:
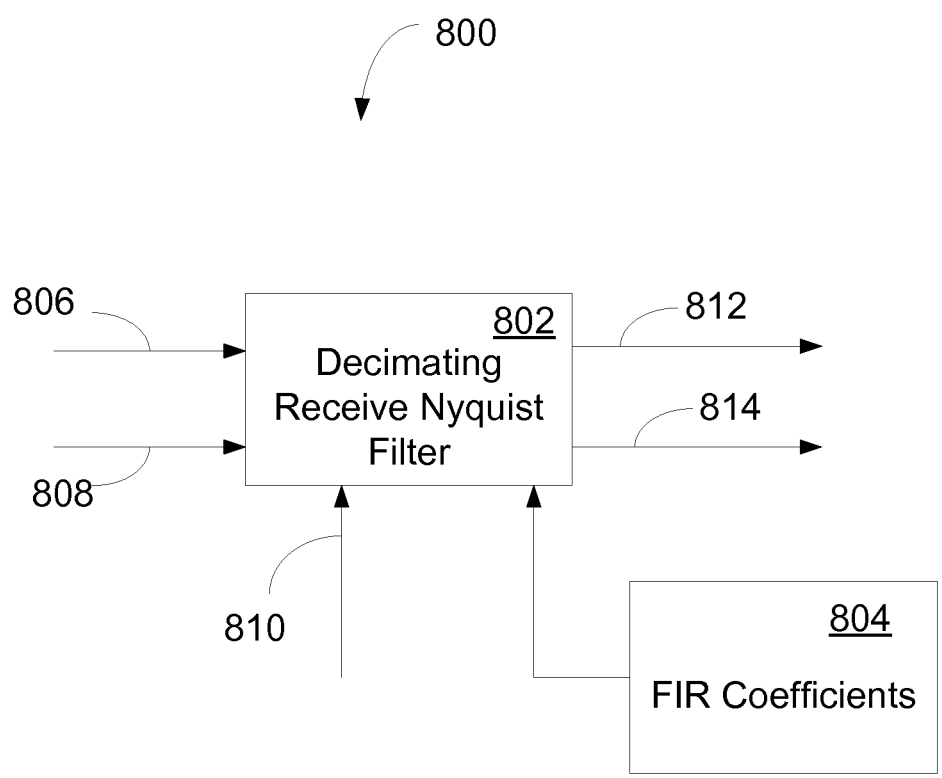
FIG. 8 is a block diagram of an illustrative decimating filter according to an example embodiment of the invention.

An example Nyquist bandlimiting decimating system 800 block diagram, comprising a multirate digital decimating filter, is shown in FIG. 8. The input digital data signal 806 comes in at two samples per symbol, and a set each of Nyquist-shaped detection 812 and transition 814 samples go out, at a combined effective rate of two samples per symbol. The input digital data signal 806 samples as well are twice successively convolved at one sample per symbol yielding alternate output samples. In an example data demodulator application embodiment, the Nyquist-shaped data detection 812 samples would feed a data symbol detector, as well as the leveling control and carrier recovery circuits. Data transition 814 samples would drive symbol timing recovery circuitry.

According to example embodiments, a decimating receive Nyquist filter 802 may apply one or more of anti-aliasing, sampling, and pre-averaging to the incoming input digital signal 806 stream. FIR coefficients 804 may then be applied to produce decimated Nyquist-shaped detection 812 samples, which may be further demodulated. In accordance with example embodiments of the invention, the input digital data signal 806 may be sampled and down converted, where the down conversion ratio may be set by the input sample rate NRs 808, 810. In certain example embodiments the value N may be set to 2. In other example embodiments the N can be set to any convenient required by the system design.

Figure 9:
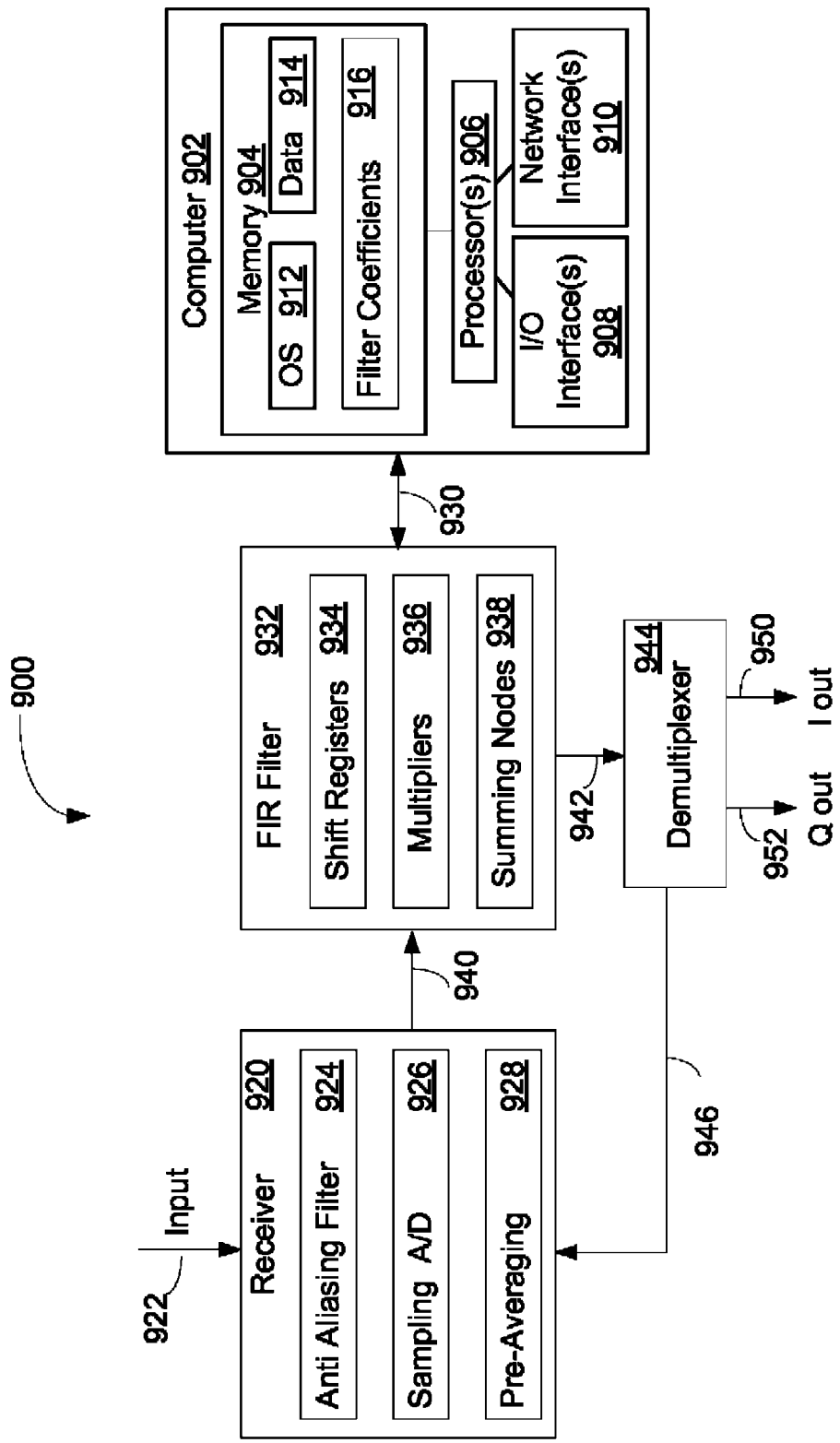
FIG. 9 is a block diagram of an illustrative receiver-side sampling and filtering system according to an example embodiment of the invention.

FIG. 9 depicts another block diagram of an example Nyquist bandlimiting decimating system 900, comprising a multirate digital decimating filter. According to example embodiments of the invention, certain hardware may be included for implementing the Nyquist bandlimiting decimating system 900. For example, the system 900 may include a receiver 920 for receiving input data 922. The receiver may include an anti-aliasing filter 924, a sampling analog to digital converter 926, and a pre-averaging filter/decimator 928. (The pre-averaging filter/decimator will be further explained with reference to FIGS. 10 and 11 below). The receiver may adjust the sample rate of the input data 922 based on a sample rate error signal 946 to produce pre-averaged data 940 for further filtering with a FIR filter 932.

The Nyquist bandlimiting decimating system 900 may also include a computer 902 having at least one memory 904 and one or more processors 906. The at least one memory 904 may be accessible by the one or more processors 906, and filter coefficients 916 may be stored in the one or more memories 904. The one or more processors may be programmed, operable to, or configured for providing filter coefficients for utilization in a convolution with pre-averaged data 940 via a FIR filter 932. The FIR filter 932 may include shift registers 934, multipliers 936, and summing nodes 938. The FIR filter 932 may produce Nyquist bandlimited symbol data 942, which may be demultiplexed by a demultiplexer 944. According to an example embodiment, the demultiplexer 944 may produce in-phase (I) decimated samples 950 and/or quadrature phase (Q) decimated samples 952. The demodulator may also detect zero-crossing samples to produce a sample rate error signal 946 for adjusting the receiver 920 sample rate. According to example embodiments of the invention, the one or more processors 906 may be configured, programmed, or operable to perform memory 904 accesses, timing, and other functions associated with the convolution process. A particular implementation of pre-averaging filter/decimator 928 will be discussed below with reference to FIGS. 10 and 11.

Figure 10:
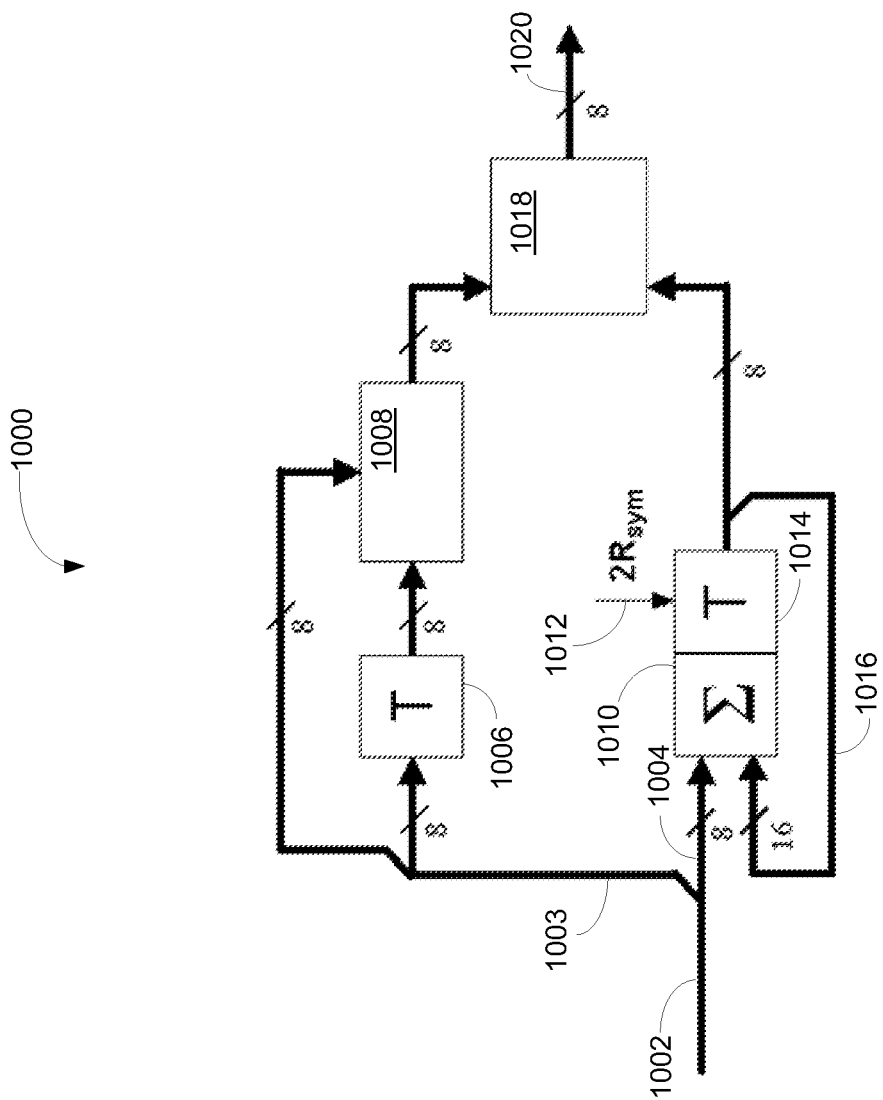
FIG. 10 is a block diagram of an illustrative pre-averaging filter/decimator according to an example embodiment of the invention.

A block diagram of a pre-averaging filter/decimator 1000 is depicted in FIG. 10. According to example embodiments, the pre-averaging filter/decimator 1000 reduces the hardware requirement of the PASCoDec filter. For example, samples from an incoming signal 1002 (sampled at N samples per symbol) may be averaged down through one of two paths 1003, 1004 depending on the number N of samples per symbol, to decimated I or Q output samples 1020 at two samples per symbol. The output may be further processed with a precision filter, which may be pre-distorted to compensate for the effect of averaging. According to example embodiments, when the number of samples per symbol is greater than three, an accumulator comprising a summing node 1010, a shift register 1014, and an averaging loop 1016 may operate at the sample rate, and the shift register 1014 output may be sampled and reset 1012 at two samples per symbol. According to example embodiments, the pre-averaging filter/decimator 1000 would be bypassed if the incoming sample rate is already at two samples per symbol.

In the case where the number of samples per symbol is three, the three-to-two averaging path is not as straightforward. In one embodiment, the incoming samples may be upsampled by two, prior to downsampling by three, but such an embodiment would cut the maximum operational speed in half. According to an example embodiment of the invention, when the number of samples per symbol is three, a fairly direct, sample averaging approach may be accomplished via a shift register 1006, combining logic 1008, and a sample multiplexer 1018 to average down each incoming 3-tuple sample set to a uniformly time-spaced 2-tuple. The process may be described with reference to FIG. 11.

Figure 11:
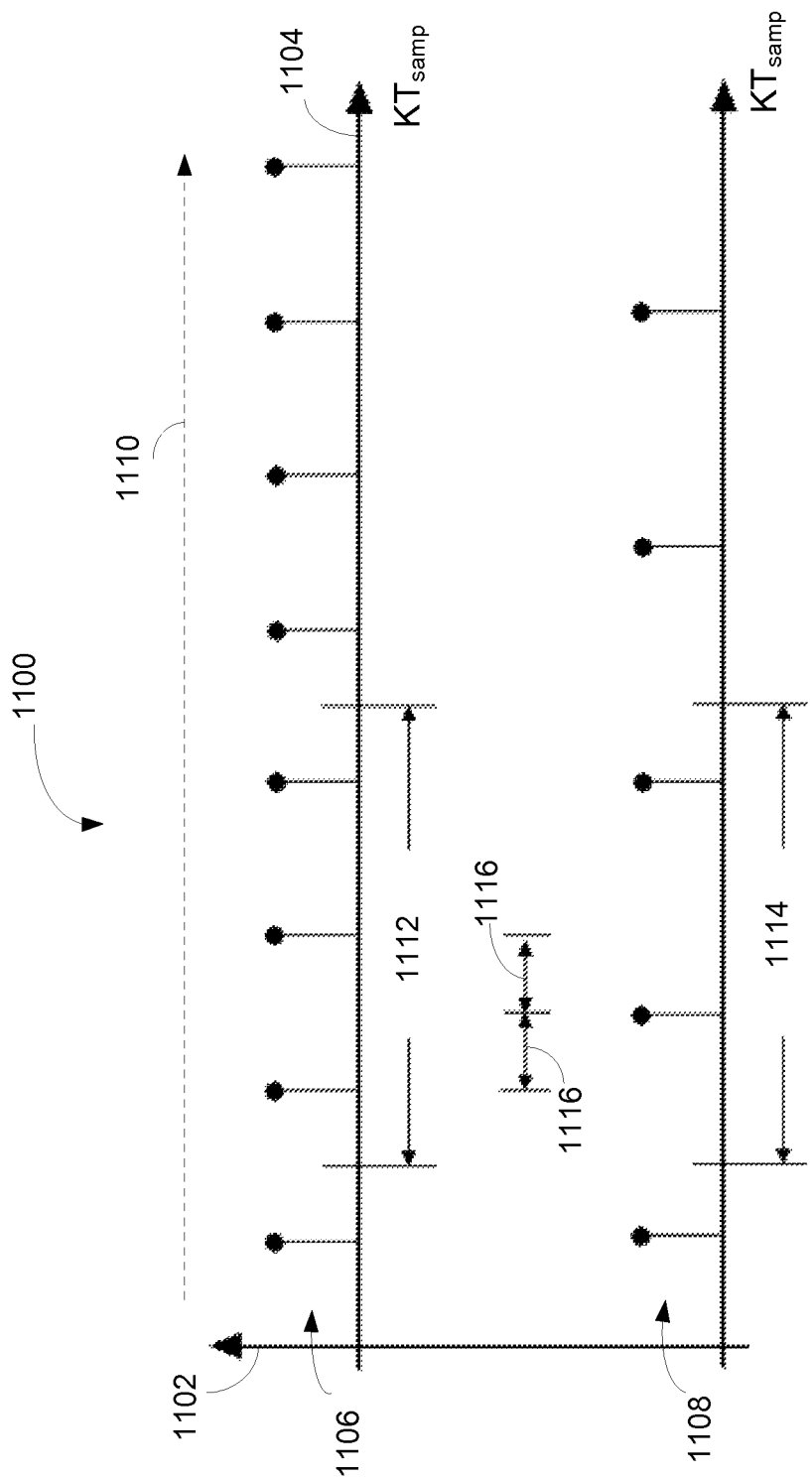
FIG. 11 is a graphical depiction of staggered convolution finite impulse response (FIR) filtering, according to an example embodiment of the invention.

FIG. 11 shows a graphical representation amplitude 1102 vs. scaled time 1104 where each incoming 3-tuple sample set 1112 may be averaged down to a uniformly time-spaced 2-tuple set 1114. Although, there are countless ways to linearly interpolate incoming 3-tuple samples 1106 to yield uniformly spaced 2-tuple output samples 1108, a simple way is to pass one of the input samples, and average the other two in the 3-tuple sample set 1112. The averaging may be accomplished by proportionally combining the remaining two samples to yield an output sample that always falls halfway between the passed samples, or that is offset by ½ sample time 1116 from 3-tuple samples 1106, as shown in FIG. 11. In this embodiment, only a bit shift is necessary, rather than a multiplication.

Figure 12:
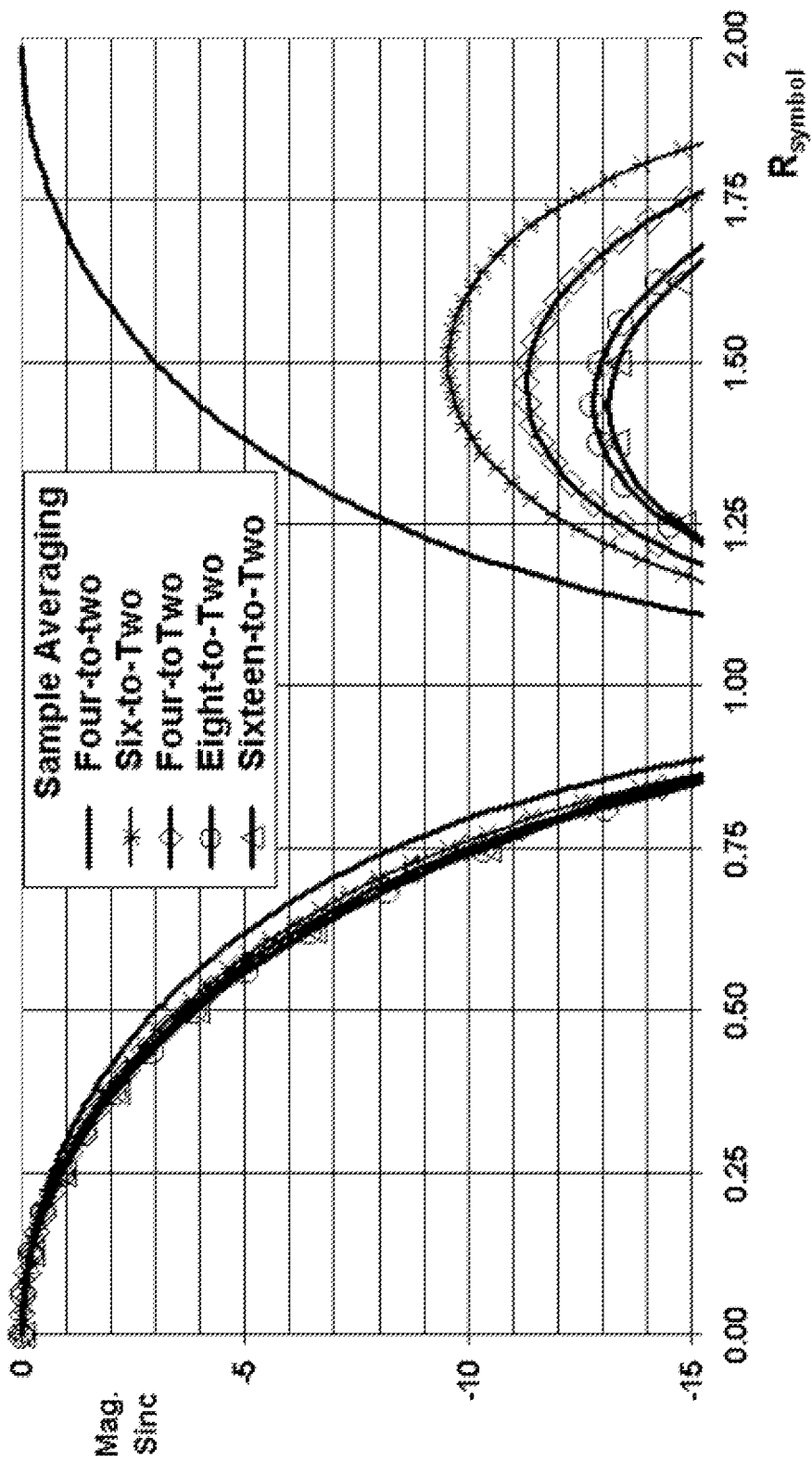
FIG. 12 is a graphical depiction of pre-averaging sample decimation, according to example embodiments of the invention.

According to example embodiments of the invention, pre-averaging is known to cause a sinc (e.g., $\sin(\pi f/R_{sym})/(\pi f/R_{sym})$) spectral aperture effect on the Nyquist channel, where $R_{sym}$ is the symbol rate. This characteristic becomes more varied as the number of samples in the averaging window gets smaller. FIG. 12 shows the spectral aperture effect for several averaging ratios. The spectral aperture effect results in an aliasing effect, which can be predistorted out in the subsequent filtering stage. For example, an inverse sinc filter aperture may be utilized to modify filter coefficients in the subsequent FIR filter processing of the signal.

TABLE 3

Baseband Sample Rates

| Symbol Rate Range | | Samples/ Symbol | Sample Rate Range | |
|---|---|---|---|---|
| Min (Ksps) | Max (Ksps) | | Min (Msps) | Max (Msps) |
| 58.59 | 78.13 | 1536 | 90.00 | 120.00 |
| 78.13 | 117.19 | 1024 | 80.00 | 120.00 |
| 117.19 | 156.25 | 768 | 90.00 | 120.00 |
| 156.25 | 234.38 | 512 | 80.00 | 120.00 |
| 234.38 | 312.50 | 384 | 90.00 | 120.00 |
| 312.50 | 468.75 | 256 | 80.00 | 120.00 |
| 468.75 | 625.00 | 192 | 90.00 | 120.00 |
| 625.00 | 937.50 | 128 | 80.00 | 120.00 |
| 937.50 | 1250.00 | 96 | 90.00 | 120.00 |
| 1250.00 | 1875.00 | 64 | 80.00 | 120.00 |
| 1875.00 | 2500.00 | 48 | 90.00 | 120.00 |
| 2500.00 | 3750.00 | 32 | 80.00 | 120.00 |

TABLE 3-continued

Baseband Sample Rates

| Symbol Rate Range | | Samples/ Symbol | Sample Rate Range | |
|---|---|---|---|---|
| Min (Ksps) | Max (Ksps) | | Min (Msps) | Max (Msps) |
| 3750.00 | 5000.00 | 24 | 90.00 | 120.00 |
| 5000.00 | 7500.00 | 16 | 80.00 | 120.00 |
| 7500.00 | 10000.00 | 12 | 90.00 | 120.00 |
| 10000.00 | 15000.00 | 8 | 80.00 | 120.00 |
| 15000.00 | 20000.00 | 6 | 90.00 | 120.00 |
| 20000.00 | 30000.00 | 4 | 80.00 | 120.00 |
| 30000.00 | 40000.00 | 3 | 90.00 | 120.00 |
| 40000.00 | 60000.00 | 2 | 80.00 | 120.00 |

According to example embodiments, continuously variable rate operation may be achieved by gear shifting the number of samples per symbol. TABLE 3 above lists sample rates and ranges for continuously variable rate operation with baseband gear shifting for a pre-averaged staggered convolution decimating (PASCoDec) filter, according to an example embodiment of the invention. The sample rate may be kept in a fixed range, such that only a single anti aliasing (AA) filter is necessary. For purposes of illustration, a maximum data rate of 60 M symbols/sec has been arbitrarily set. In TABLE 3, note that each octave in data symbol rate is broken up into two ratio regions, 1:1.5 and 1:1.33, where the upper range always has samples per symbol that are powers-of-two, and the lower range has samples per symbol that are powers-of-two times 3. Also, observe that the sample rates always fall within a 1:1.5 range. Hence, in a motor vehicle analogy, the sample rate is analogous to engine RPM, the number of samples per symbol to the gear ratio, and the data symbol rate to actual vehicle speed. The lowest integer power would be two samples per symbol, for this type of modem application using baseband Nyquist sampling.

TABLE 4 below lists sample rates and ranges for continuously variable rate operation with intermediate frequency (IF) gear shifting for a pre-averaged staggered convolution decimating (PASCoDec) filter, according to an example embodiment of the invention. For the case of intermediate frequency (IF) sampling, the minimum number of samples per symbol is double what it is for baseband sampling. Hence, the maximum data rate is halved. This doubling is a direct result of it being more difficult to avoid aliasing with IF sampling. However, continuously variable rate operation is still achievable, but for a given hardware technology, the maximum data rate of operation is halved. IF sampling has other advantages in that it uses less hardware than baseband sampling, and the quadrature amplitude and phase balance is automatic and precise.

TABLE 4

IF Sample Rates

| Symbol Rate Range | | Samples/ Symbol | Sample Rate Range | |
|---|---|---|---|---|
| Min (Ksps) | Max (Ksps) | | Min (Msps) | Max (Msps) |
| 29.30 | 39.06 | 3072 | 90.00 | 120.00 |
| 39.06 | 58.59 | 2048 | 80.00 | 120.00 |
| 58.59 | 78.13 | 1536 | 90.00 | 120.00 |
| 78.13 | 117.19 | 1024 | 80.00 | 120.00 |
| 117.19 | 156.25 | 768 | 90.00 | 120.00 |
| 156.25 | 234.38 | 512 | 80.00 | 120.00 |
| 234.38 | 312.50 | 384 | 90.00 | 120.00 |

TABLE 4-continued

IF Sample Rates

| Symbol Rate Range | | Samples/ Symbol | Sample Rate Range | |
|---|---|---|---|---|
| Min (Ksps) | Max (Ksps) | | Min (Msps) | Max (Msps) |
| 312.50 | 468.75 | 256 | 80.00 | 120.00 |
| 468.75 | 625.00 | 192 | 90.00 | 120.00 |
| 625.00 | 937.50 | 128 | 80.00 | 120.00 |
| 937.50 | 1250.00 | 96 | 90.00 | 120.00 |
| 1250.00 | 1875.00 | 64 | 80.00 | 120.00 |
| 1875.00 | 2500.00 | 48 | 90.00 | 120.00 |
| 2500.00 | 3750.00 | 32 | 80.00 | 120.00 |
| 3750.00 | 5000.00 | 24 | 90.00 | 120.00 |
| 5000.00 | 7500.00 | 16 | 80.00 | 120.00 |
| 7500.00 | 10000.00 | 12 | 90.00 | 120.00 |
| 10000.00 | 15000.00 | 8 | 80.00 | 120.00 |
| 15000.00 | 20000.00 | 6 | 90.00 | 120.00 |
| 20000.00 | 30000.00 | 4 | 80.00 | 120.00 |

Figure 13:
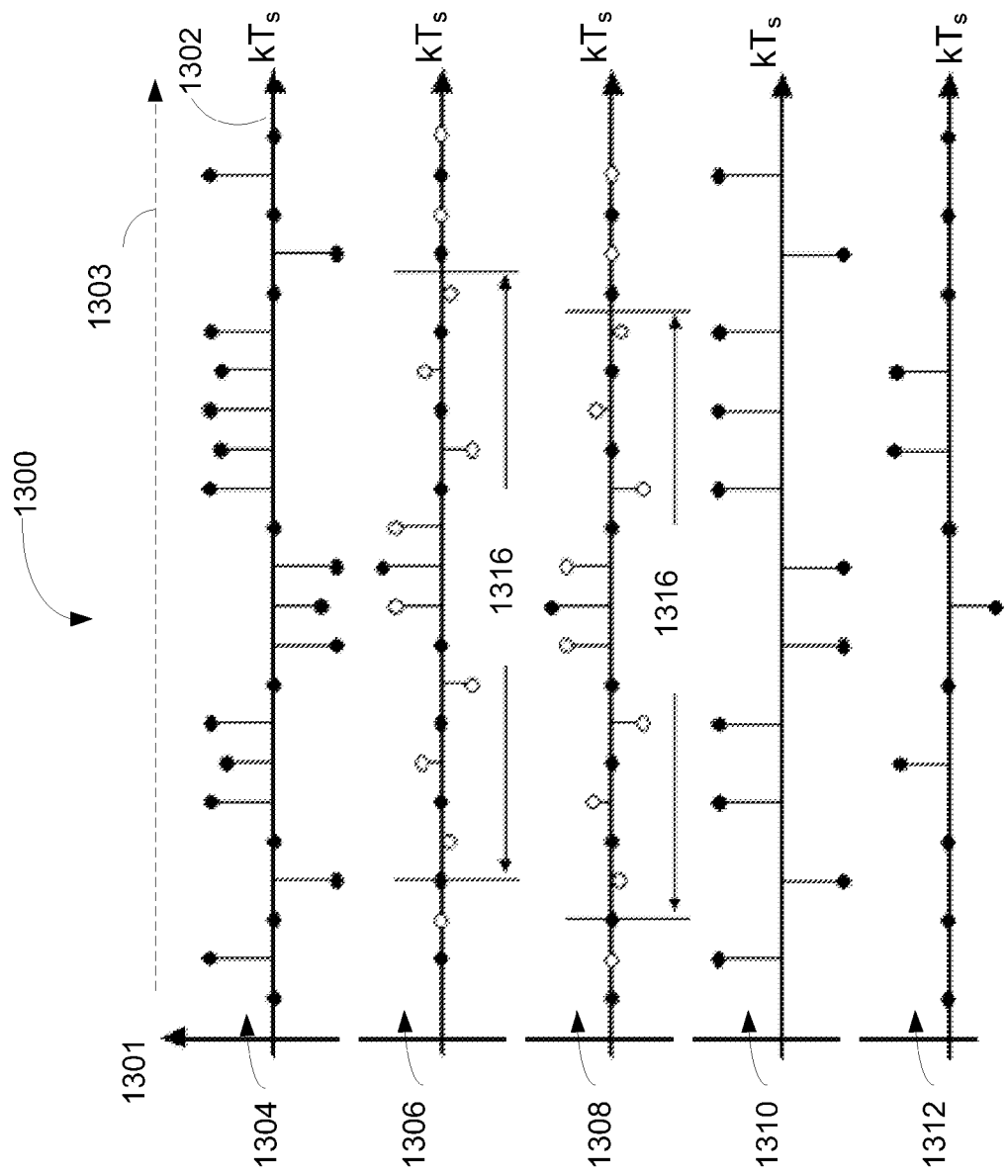
FIG. 13 is a graphical depiction of an illustrative FIR filtering system according to an example embodiment of the invention.

A pictorial example 1300 of the sliding convolution interpolating (SCI) filter, as applied to a Nyquist bandlimiting application, is shown in FIG. 13. This figure shows sample amplitudes 1301 vs. sample scaled time 1302 for continuously clocked samples 1303. According to example embodiments of the invention, incoming bandlimited signal (plus noise) 1304 representing N samples per symbol may be clocked, for example, from a pre-averaging decimator into a decimating receive Nyquist filter 802, as was shown in FIG. 8. In this pictorial example 1300, the incoming bandlimited signal (plus noise) 1304 represents two samples per symbol. According to example embodiments, a decimated spectral shaping impulse response sample set 1306 having a finite FIR aperture comprising decimated finite impulse response (FIR) aperture impulse response coefficients 1316, may be convolved with the incoming bandlimited signal (plus noise) 1304 to produce decimated signal and noise output detection samples 1310 (e.g., detected output samples). In example embodiments of the invention, the decimated spectral shaping impulse response sample set 1306 (FIR filter waveform samples) may be selected from any number of FIR filter impulse responses. In an example embodiment, the decimated spectral shaping impulse response sample set 1306 (FIR filter waveform samples) may be modeled from a "raised cosine" impulse response, which is one of the most well-known filtering functions of the Nyquist filter function family. Then, a decimated staggered spectral shaping impulse response sample set 1308 having a finite FIR aperture comprising decimated finite impulse response (FIR) aperture impulse response coefficients 1316 may be convolved with the incoming bandlimited signal (plus noise) 1304 to produce decimated signal and noise output transition samples 1312 (e.g., zero-crossing transition samples). According to example embodiments of the invention, the decimated signal and noise output transition samples 1312 may represent zero crossings of the symbol data, and therefore, may be used in timing the sampling rate of the SCI system, for example, by providing a running average of the decimated signal and noise output transition samples 1312 for input to the sampling rate controller, as was shown in FIG. 9 with regard to the sample rate error signal 946.

Figure 14:
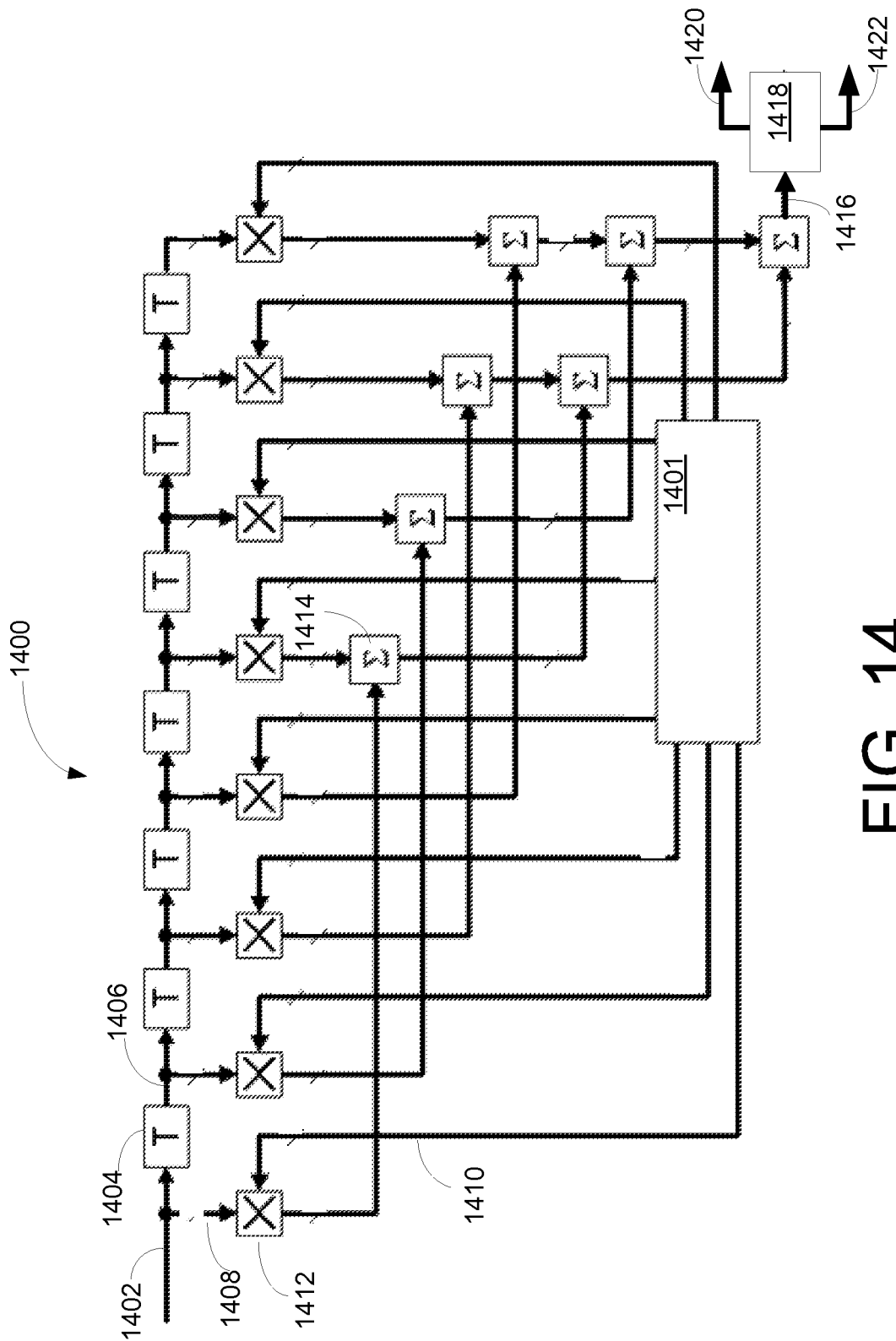
FIG. 14 is a graphical spectral depiction of anti-aliasing (replication removal) with baseband sampling, according to example embodiments of the invention.

According to an example embodiment of the invention, a generalized block diagram of an interpolating FIR circuit topology 1400 is shown in FIG. 14. In this example embodiment, a FIR coefficient memory 1401 may be utilized to store and access FIR coefficients. The topology 1400 may include a plurality of shift registers 1404, multipliers 1412, and summation blocks 1416. In an example embodiment, an input sample stream 1402, which may comprise I or Q data plus noise, and may be continuously clocked through the shift registers 1404. Then, after each shifting, the sample 1408 at the input and the successively shifted samples 1406 may be multiplied via multipliers 1412 with FIR coefficients 1410. The resulting samples may then be successively summed by summing nodes 1414, resulting in output filtered bandlimited data 1416. The output filtered bandlimited data 1416 may then be further processed by a demultiplexer 1418 to produce detection I or Q decimated samples out 1420 and zero crossing I or Q decimated samples out 1422.

Example values for the various elements of the interpolating FIR circuit topology 1400 may include: aperture widths=eight symbol times (depicted by the number of shift registers T 1404); 8×8-bit digital multipliers 1412; data symbol rate range operable to vary over three orders-of-magnitude; data sample rate range about half an octave; filter coefficient memory 1401 size approximately equal to the maximum number of samples per symbol times the number of symbols in aperture times the number of bits per sample. Hence, as is apparent from FIG. 14, the performance burden is on the memory size and speed to keep the implementation compact and flexible.

Figure 15:
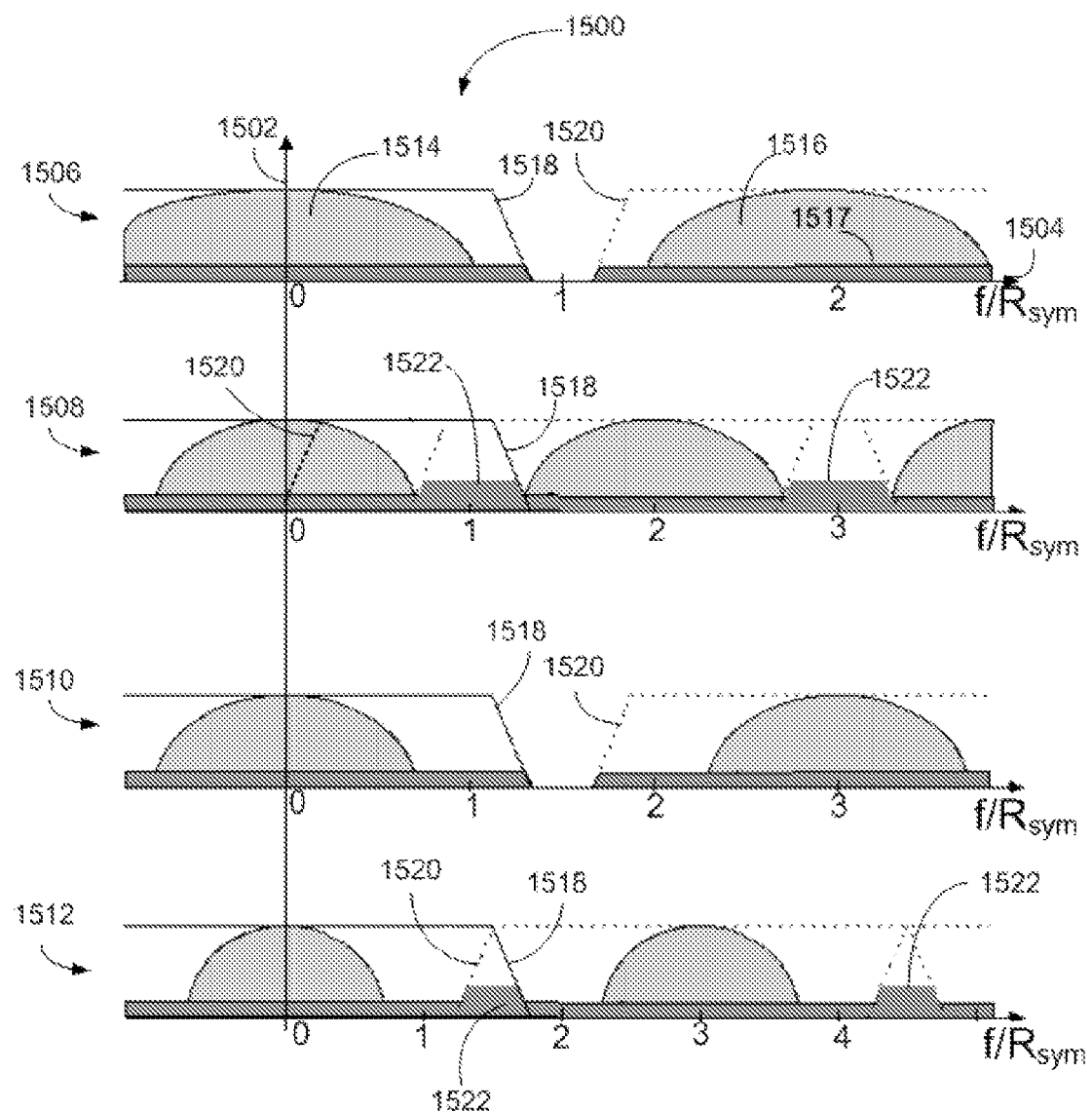
FIG. 15 is a graphical spectral depiction of anti-aliasing (replication removal) with IF sampling, according to example embodiments of the invention.

FIG. 15 depicts a frequency-domain representation of an anti aliasing (AA) filtering and gear shifting technique 1500 for baseband sampling and for the case where the data rate is continuously varied, according to example embodiments of the invention. FIG. 15 depicts demodulated spectra amplitude 1502 vs. scaled frequency 1504. FIG. 15 also depicts example baseband spectra 1514 and replicas due to sampling 1516. According to example embodiments, the AA (replication removal) filter 1518 may be situated to remove unwanted spectral content, including noise 1517, or replicas due to sampling 1516. In an example embodiment, the AA (replication removal) filter 1518 may comprise an elliptic analog filter function with an equiripple bandwidth on the order of ¾ the maximum data symbol rate, and with a passband-to-stopband shape-factor on the order of 1.15. The figure depicts spectral filtering conditions in the highest octave of operation at the maximum symbol rate at two samples/symbol 1506, minimum symbol rate at two samples/symbol 1508, maximum symbol rate at three samples/symbol 1510, and minimum symbol rate at three samples/symbol 1512. Accordingly, subsequent octaves may occupy less bandwidth and may be progressively less affected by the anti-aliasing filter 1518 characteristics. In certain gear-shifting settings, the noise floor 1517 may be aliased 1522. In these situations, additional filtering may be applied, according to example embodiments, to further reduce any noise that is passed.

Figure 16:
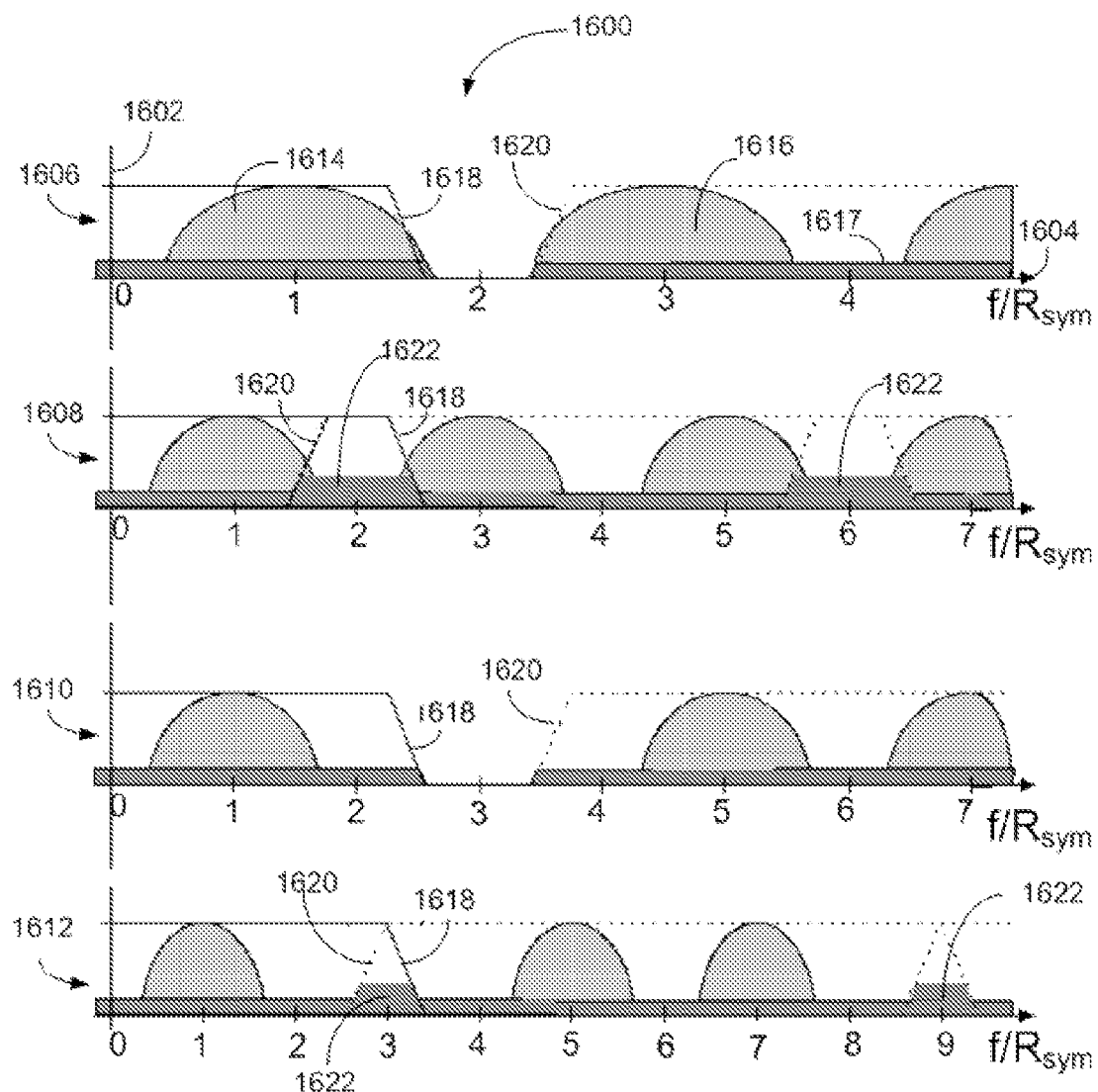
FIG. 16 is a graphical spectral depiction of pre-averaging frequency response aperture effects for various decimation ratios, according to example embodiments of the invention.

FIG. 16 depicts a frequency-domain representation of an anti-aliasing (AA) filtering and gear-shifting technique 1600 (which is analogous to the baseband case) for IF sampling in the first Nyquist zone, and for the case where the data rate is continuously varied, according to example embodiments of the invention. FIG. 16 depicts demodulated spectra amplitude 1602 vs. scaled frequency 1604. FIG. 16 also depicts example IF spectra 1614 and replicas due to sampling 1616. According to example embodiments, the AA (replication removal) filter 1618 may be situated to remove unwanted spectral content, including noise 1617, or replicas due to sampling 1616. In an example embodiment, the AA (replication removal) filter 1618 may comprise an elliptic analog filter function with an equiripple bandwidth on the order of 3/2 the maximum data symbol rate, and with a passband-to-stopband shape-factor on the order of 1.15. The figure depicts spectral filtering conditions in the highest octave of operation at the maximum symbol rate at 4 samples/symbol 1606, minimum symbol rate at 4 samples/symbol 1608, maximum symbol rate at 6 samples/symbol 1610, and minimum symbol rate at 6 samples/symbol 1612. Accordingly, subsequent octaves may occupy less bandwidth and may be progressively less affected by the AA filter 1618 characteristics. In certain gear-shifting settings, the noise 1617 may be aliased 1622. In these situations, additional filtering may be applied, according to example embodiments, to further reduce any noise that is passed.

According to example embodiments of the invention, the spectral occupancy at the highest data rate in the first octave of operation may be broad enough that the lowpass elliptic AA filter used in the baseband filter may also be applicable to the IF filter, allowing the implementation to be digitally-switched from lowpass to bandpass sampling, without changing the AA filter 1618.

Figure 17:
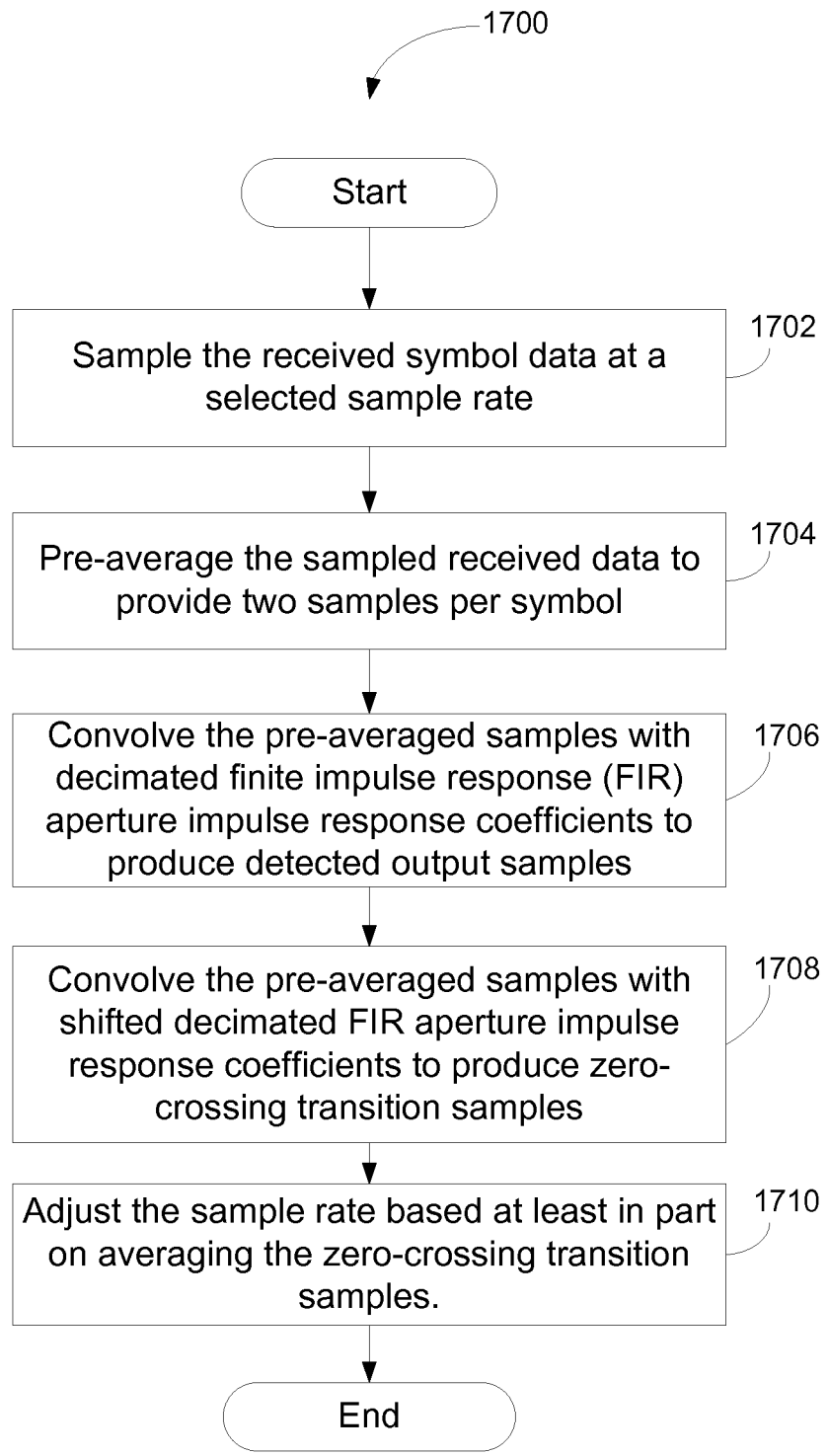
FIG. 17 is a flow diagram of an example method for implementing a multirate digital decimating filter for filtering received symbol data, according to an example embodiment of the invention.

An example method 1700 for implementing a multirate digital decimating filter (e.g., the pre-averaged staggered convolution decimating (PASCoDec) filter) will now be described with reference to the flow diagram of FIG. 17. In block 1702 and according to an example embodiment of the invention, the method may include sampling the received symbol data at a selected sample rate. In block 1704, the received sampled symbol data is pre-averaged to provide two samples per symbol. In block 1706, the pre-averaged samples are convolved with the decimated FIR aperture impulse response coefficients to produce detected output samples. In block 1708, the pre-averaged samples are convolved with shifted decimated FIR aperture impulse response coefficients to produce zero-crossing transition samples. In block 1710, the sample rate is adjusted based at least in part on averaging the zero-crossing transition samples.

The embodiments depicted in the tables and figures herein are sized for a digital data transmission application where the maximum rate is 60 M symbols/sec. Other applications could result in FIR filters with longer or shorter apertures, different bit resolutions, different sample pipelining, etc. Moreover, the direct form, FIR topology is shown in FIG. 14, whereas other standard-form topologies could be used, in accordance with alternate embodiments of the invention. A beneficial aspect of the invention is the use of a pre-averager in conjunction with repeated application of filter coefficients. Alternately, a single multiplier-accumulator could be used; but for this example, it would need to be eight times faster than the implementation of FIG. 14. A table look-up approach, where the filtering convolution results are pre-computed, could also be utilized; however, such an approach typically is not practical when the input data contains noise.

Accordingly, example embodiments of the invention can provide the technical effects of creating certain systems and methods for implementing a pre-averaged staggered convolution decimating filter. Embodiments of the invention can provide the further technical effects of providing systems and methods for operating the filter over several orders of magnitude in data rate with a single analog filter. Embodiments of the invention may also provide the technical effects of creating certain systems and methods that provide operating the filter for either baseband or IF sampling. Embodiments of the invention can provide the further technical effects of providing systems and methods for a simple compact filtering digital signal processing (DSP) element topology with continuous, inherent augmentation ability as the digital accumulator and memory technology is advanced. Embodiments of the invention can also provide systems and methods for filtering where amplitude and phase pre-distortion may be directly built into the FIR characteristics.

In example embodiments of the invention, the Nyquist bandlimiting interpolation system 100, 200 and the Nyquist bandlimiting decimating system 800, 900 may include any number of software applications that are executed to facilitate any of the operations.

In example embodiments, one or more input/output interfaces may facilitate communication between the Nyquist bandlimiting interpolation system 100, 200 or the Nyquist bandlimiting decimating system 800, 900, and one or more input/output devices. For example, a universal serial bus port, a serial port, a disk drive, a CD-ROM drive, and/or one or more user interface devices, such as a display, keyboard, keypad, mouse, control panel, touch screen display, microphone, etc., may facilitate user interaction with the Nyquist bandlimiting interpolation system 100, 200 or the Nyquist bandlimiting decimating system 800, 900. The one or more input/output interfaces may be utilized to receive or collect data and/or user instructions from a wide variety of input devices. Received data may be processed by one or more computer processors as desired in various embodiments of the invention and/or stored in one or more memory devices.

One or more network interfaces may facilitate connection of the Nyquist bandlimiting interpolation system 100, 200 or the Nyquist bandlimiting decimating system 800, 900 inputs and outputs to one or more suitable networks and/or connections; for example, the connections that facilitate communication with any number of sensors associated with the system. The one or more network interfaces may further facilitate connection to one or more suitable networks; for example, a local area network, a wide area network, the Internet, a cellular network, a radio frequency network, a Bluetooth™ enabled network, a Wi-Fi™ enabled network, a satellite-based network, any wired network, any wireless network, etc., for communication with external devices and/or systems.

As desired, embodiments of the invention may include the Nyquist bandlimiting interpolation system 100, 200 and/or the Nyquist bandlimiting decimating system 800, 900 with more or less of the components illustrated in any of these figures herein.

The invention is described above with reference to block and flow diagrams of systems, methods, apparatuses, and/or computer program products according to example embodiments of the invention. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, or may not necessarily need to be performed at all, according to some embodiments of the invention.

These computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, embodiments of the invention may provide for a computer program product, comprising a computer-usable medium having a computer-readable program code or program instructions embodied therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions. While the invention has been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose the invention, including the best mode, and also to enable any person skilled in the art to practice the invention, including making and using any devices or systems and performing any incorporated methods. The patentable scope of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The claimed invention is:

1. A method for implementing a multirate digital interpolating filter comprising:
    sampling, by a computer comprising one or more processors, symbol data from one sample per symbol to N samples per symbol, wherein sampling comprises:
    convolving, by the computer, the symbol data with a decimated finite impulse response (FIR) aperture impulse response coefficient set;
    convolving, by the computer, the symbol data with shifted decimated FIR aperture impulse response coefficient sets; and
    summing, by the computer, the convolution results to produce interpolated bandlimited data.

2. The method of claim 1, wherein sampling the symbol data comprises one or more of upsampling or spectral shaping symbol data.

3. The method of claim 1, wherein convolving the symbol data with shifted decimated FIR aperture impulse response coefficient sets comprises convolving, by the computer, the symbol data with one-to-N-shifted decimated FIR aperture impulse response coefficient sets, wherein the one-to-N-shifted decimated FIR aperture impulse response coefficient sets are shifted by one-to-N samples with respect to the decimated FIR aperture impulse response coefficient set.

4. The method of claim 1, further comprising filtering, by the computer, the interpolated bandlimited data to remove spectral replicas.

5. The method of claim 1, wherein sampling the symbol data comprises sampling, by the computer, digital symbols, wherein the digital symbols comprise one or more of in-phase or quadrature-phase symbol data.

6. The method of claim 1, wherein convolving the symbol data with the decimated FIR aperture impulse response coefficient set comprises convolving, by the computer, the symbol data with a Nyquist filtering function.

7. The method of claim 1, wherein sampling symbol the data provides a sample per symbol rate of powers-of-two times three or powers-of-two.

8. A system for implementing a multirate digital interpolating filter comprising:
    at least one memory for storing FIR aperture impulse response coefficients;
    at least one processor configured to access the at least one memory and further configured to upsample symbol data from one sample per symbol to N samples per symbol, wherein upsampling comprises:
        convolving the symbol data with a decimated FIR aperture impulse response coefficient set;
        convolving the symbol data with one or more shifted decimated FIR aperture impulse response coefficient sets; and
        summing the convolution results to produce interpolated bandlimited data; and
    at least one modulator for upconverting at least a portion of the interpolated bandlimited data.

9. The system of claim 8, wherein the symbol data comprises one or more of in-phase or quadrature-phase symbol data.

10. The system of claim 8, wherein convolving the symbol data with shifted decimated FIR aperture impulse response coefficient sets comprises convolving the symbol data with one-to-N-shifted decimated FIR aperture impulse response coefficient sets, wherein the one-to-N-shifted decimated FIR aperture impulse response coefficient sets are shifted by one-to-N samples with respect to the decimated FIR aperture impulse response coefficient set.

11. The system of claim 8, further comprising at least one filter configured to remove spectral replicas from the interpolated bandlimited data.

12. The system of claim 8, wherein the symbol data comprises digital data.

13. The system of claim 8, wherein the FIR aperture impulse response coefficient set comprises a raised cosine FIR aperture impulse response or an impulse response modeled from Nyquist filtering functions.

14. The system of claim 8, wherein the at least one processor is further configured to upsample symbol data at a sample per symbol rate of powers-of-two times three or powers-of-two.

15. The system of claim 8, further comprising one or more digital-to-analog converters.

16. A filter for sampling digital data comprising:
    at least one memory for storing FIR aperture impulse response coefficients;
    at least one processor configured to access the at least one memory and further configured to upsample symbol data from one sample per symbol to N samples per symbol, wherein upsampling comprises:

convolving the symbol data with a decimated FIR aperture impulse response coefficient set;
convolving the symbol data with one or more shifted decimated FIR aperture impulse response coefficient sets; and
summing the convolution results to produce interpolated bandlimited data.

17. The filter of claim 16, wherein the symbol data comprises one or more of in-phase or quadrature-phase symbol data.

18. The filter of claim 16, wherein convolving the symbol data with shifted decimated FIR aperture impulse response coefficient sets comprises convolving the symbol data with one-to-N-shifted decimated FIR aperture impulse response coefficient sets, wherein the one-to-N-shifted decimated FIR aperture impulse response coefficient sets are shifted by one-to-N samples with respect to the decimated FIR aperture impulse response coefficient set.

19. The filter of claim 16, wherein the FIR aperture impulse response coefficient set comprises a raised cosine FIR aperture impulse response or an impulse response modeled from Nyquist filtering functions.

20. The filter of claim 16, wherein the at least one processor is further configured to upsample symbol data at a sample per symbol rate of powers-of-two times three or powers-of-two.

* * * * *